(12) United States Patent
Cheng

(10) Patent No.: US 11,495,659 B2
(45) Date of Patent: Nov. 8, 2022

(54) SEMICONDUCTOR DEVICE

(71) Applicant: TAIWAN SEMICONDUCTOR MANUFACTURING CO., LTD., Hsinchu (TW)

(72) Inventor: An-Hao Cheng, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/921,171

(22) Filed: Jul. 6, 2020

(65) Prior Publication Data

US 2020/0335578 A1  Oct. 22, 2020

Related U.S. Application Data

(62) Division of application No. 16/132,592, filed on Sep. 17, 2018, now Pat. No. 10,707,295.

(51) Int. Cl.
| | |
|---|---|
| *H01L 29/66* | (2006.01) |
| *H01L 49/02* | (2006.01) |
| *H01L 21/8234* | (2006.01) |
| *H01L 21/768* | (2006.01) |
| *H01L 29/423* | (2006.01) |
| *H01L 21/762* | (2006.01) |
| *H01L 27/108* | (2006.01) |

(52) U.S. Cl.
CPC ........ *H01L 28/60* (2013.01); *H01L 21/76224* (2013.01); *H01L 21/76816* (2013.01); *H01L 21/76897* (2013.01); *H01L 21/823468* (2013.01); *H01L 29/42364* (2013.01); *H01L 29/42372* (2013.01); *H01L 29/66545* (2013.01); *H01L 27/1087* (2013.01)

(58) Field of Classification Search
CPC ............... H01L 28/60; H01L 29/66545; H01L 21/76897; H01L 21/76816; H01L 29/42364; H01L 29/42372; H01L 21/76224; H01L 27/1087; H01L 29/66575; H01L 29/4966; H01L 29/4958; H01L 28/40–92
See application file for complete search history.

(56) References Cited

U.S. PATENT DOCUMENTS

| | | | |
|---|---|---|---|
| 2003/0036228 A1* | 2/2003 | Jao | ...... H01L 21/76229 438/200 |
| 2004/0155277 A1* | 8/2004 | Koh | ............ H01L 28/60 257/303 |
| 2007/0267705 A1 | 11/2007 | Won et al. | |
| 2014/0175583 A1 | 6/2014 | Doyle et al. | |

(Continued)

*Primary Examiner* — Shahed Ahmed
(74) *Attorney, Agent, or Firm* — Birch, Stewart, Kolasch & Birch, LLP

(57) ABSTRACT

A semiconductor device includes a semiconductor substrate, a capacitor structure, a first contact plug, and a spacer. The capacitor structure is over the semiconductor substrate. The capacitor structure includes a bottom electrode, a capacitor dielectric, and a top electrode. The bottom electrode is over the semiconductor substrate. The capacitor dielectric is over a first portion of the bottom electrode. The top electrode is over the capacitor dielectric. The first contact plug is over and electrically connected to a second portion of the bottom electrode. The spacer is adjacent at least a sidewall of the second portion of the bottom electrode.

20 Claims, 19 Drawing Sheets

(56) References Cited

U.S. PATENT DOCUMENTS

| | | | |
|---|---|---|---|
| 2014/0284671 A1* | 9/2014 | Hung | H01L 21/76802 |
| | | | 257/296 |
| 2014/0349452 A1 | 11/2014 | Wang et al. | |
| 2015/0311273 A1* | 10/2015 | Lin | H01L 28/40 |
| | | | 257/532 |
| 2015/0311435 A1* | 10/2015 | Liu | H01L 45/1253 |
| | | | 257/4 |
| 2018/0061839 A1 | 3/2018 | Baars et al. | |
| 2019/0081134 A1 | 3/2019 | Chang et al. | |

* cited by examiner

SEMICONDUCTOR DEVICE

PRIORITY CLAIM AND CROSS-REFERENCE

This application is a divisional application of U.S. patent application Ser. No. 16/132,592, filed Sep. 17, 2018, now U.S. Pat. No. 10,707,295, issued Jul. 7, 2020, the entirety of which is incorporated by reference herein in their entireties.

BACKGROUND

Advances in technology have resulted in an increasing demand for system-on-chip products where both analog and digital signal processing are desirable. Increasingly it is advantageous for both the analog circuitry and digital circuitry to be in close proximity.

Many systems rely on precise reproducibility in the electronic properties of circuit component structures, such as metal-insulator-metal (MIM) capacitors structures, to achieve the electrical matching of the various circuitry components. Electronic mismatching of circuitry components results in degraded signal processing quality and is adversely affected by deviations in critical dimensions between components. Critical dimension deviation is typically exacerbated by the increased number of processing steps required for producing a component, such as a MIM capacitor in a BEOL process. Thus, an improved MIM capacitor structure and manufacturing process achieving reduced cost and improved performance of both MIM capacitors and transistors is desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
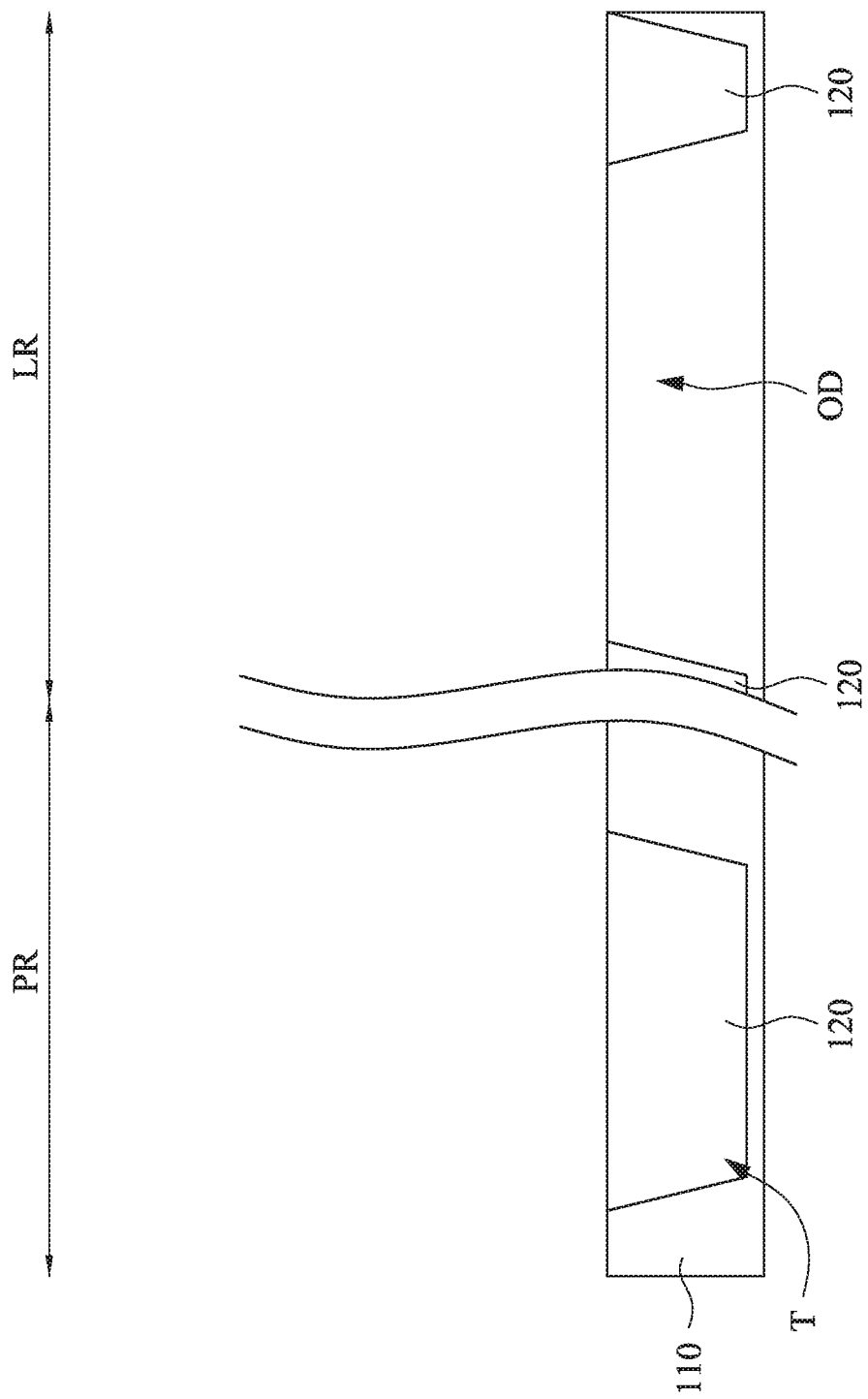
FIGS. 1A-1K are cross-sectional views of a semiconductor device at various intermediate stages of manufacture according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embedded metal-insulator-metal (MIM) capacitor structure and method for forming the same according to the invention is described with reference to an exemplary integrated circuit including an adjacent complementary Metal-Oxide-semiconductor (CMOS) transistor (e.g., MOSFET) device (e.g., on the same chip), It will be appreciated by those skilled in the art that the method of the invention may be used in the formation of other devices including adjacent capacitors (charge storing devices) and transistors such as analog radio frequency (RF) circuitry and dynamic random access memory (DRAM) devices, where an MIM capacitor structure and transistor gate structure are advantageously formed in parallel.

FIGS. 1A-1K are cross-sectional views of a semiconductor device at various intermediate stages of manufacturing a semiconductor device according to some embodiments of the present disclosure. The illustration is merely exemplary and is not intended to be limiting beyond what is specifically recited in the claims that follow. It is understood that additional operations may be provided before, during, and after the operations shown by FIGS. 1A-1K, and some of the operations described below can be replaced or eliminated for additional embodiments of the method. The order of the operations/processes may be interchangeable.

Referring to FIG. 1A, a semiconductor substrate 110 is illustrated. The semiconductor substrate 110 has a region PR where passive devices (e.g., capacitors) are to be formed and a logic region LR where logic circuits are to be formed. In some embodiments, the substrate 110 may be a semiconductor substrate, such as a bulk semiconductor, a semiconductor-on-insulator (SOI) substrate, or the like. The substrate 110 may be a chip portion of a semiconductor processing wafer, such as a silicon wafer. In some embodiments, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 110 is etched to form at least one trench T. A portion of the substrate 110 between neighboring trenches T can be referred to as an active region or an oxide defined region OD. Trenches T may be trench strips that are substantially parallel to each other. Similarly, the oxide defined regions OD are substantially parallel to each other.

Isolation dielectrics 120 are formed in the trenches T respectively, so as to separate the oxide defined regions OD from each other. In some embodiments, the isolation dielectric 120 is made of silicon oxide, silicon nitride, silicon oxynitride, fluoride-doped silicate glass (FSG), or other low-K dielectric materials. In some embodiments, the isolation dielectric 120 can have a multi-layer structure, for example, a thermal oxide liner layer with silicon nitride formed over the liner. The isolation dielectrics 120 may be formed by forming a dielectric layer covering the substrate 110 and filling the trenches T, and removing a portion of the dielectric layer outside the trenches T. It is understood that the processes described above are some examples of how shallow trench isolation (STI) structures are formed.

Figure 1B:
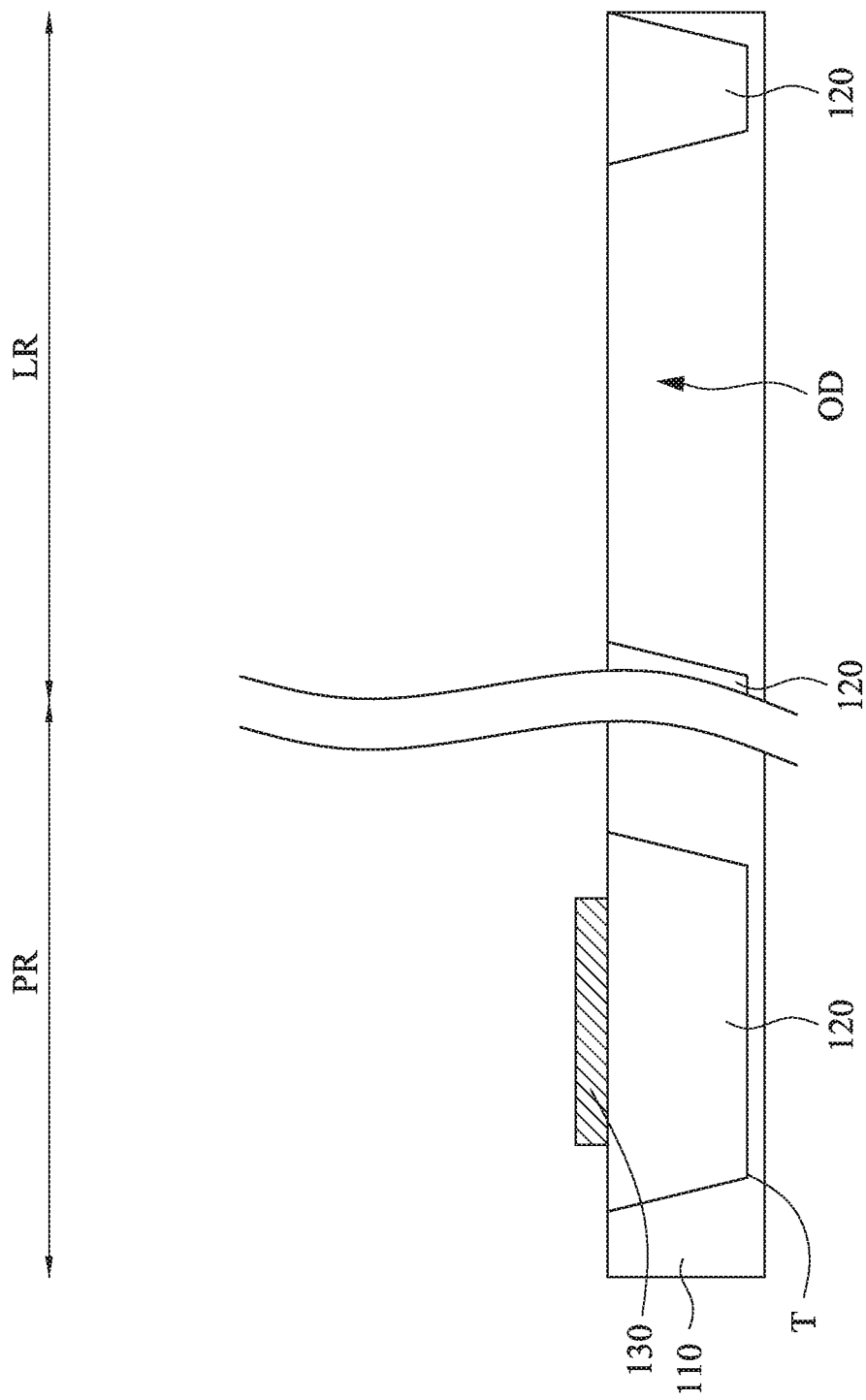

Referring to FIG. 1B, a capacitor bottom electrode 130 is formed over the region PR of the semiconductor substrate 110. The capacitor bottom electrode 130 may include metals for reducing electrical resistance for a passive device (e.g., capacitors) and high speed applications. For example, the capacitor bottom electrode 130 may be any metal containing conductor including W, WN, Ti, TiN, Mo, TaN, Cu, CuAl, and combinations thereof. The thickness of the capacitor bottom electrode 130 may be in a range of about 20 angstroms to about 150 angstroms for reducing electrical resistance and withstanding the subsequent etching process. In some embodiments, the formation of the capacitor bottom electrode 130 may include depositing an electrode layer over a top surface of the substrate 110 and removing a portion of the electrode layer, and the remaining portion of the electrode layer forms the capacitor bottom electrode 130. The formation of the electrode layer may include PVD, CVD, electrodeposition, or similar, as is appropriate for the material being deposited. Removing the portion of the electrode layer may include forming a resist etching mask pattern and subsequently performing an etching process to pattern the electrode layer. The etching process may be a dry and/or wet etching process and may be optionally anisotropic.

Figure 1C:
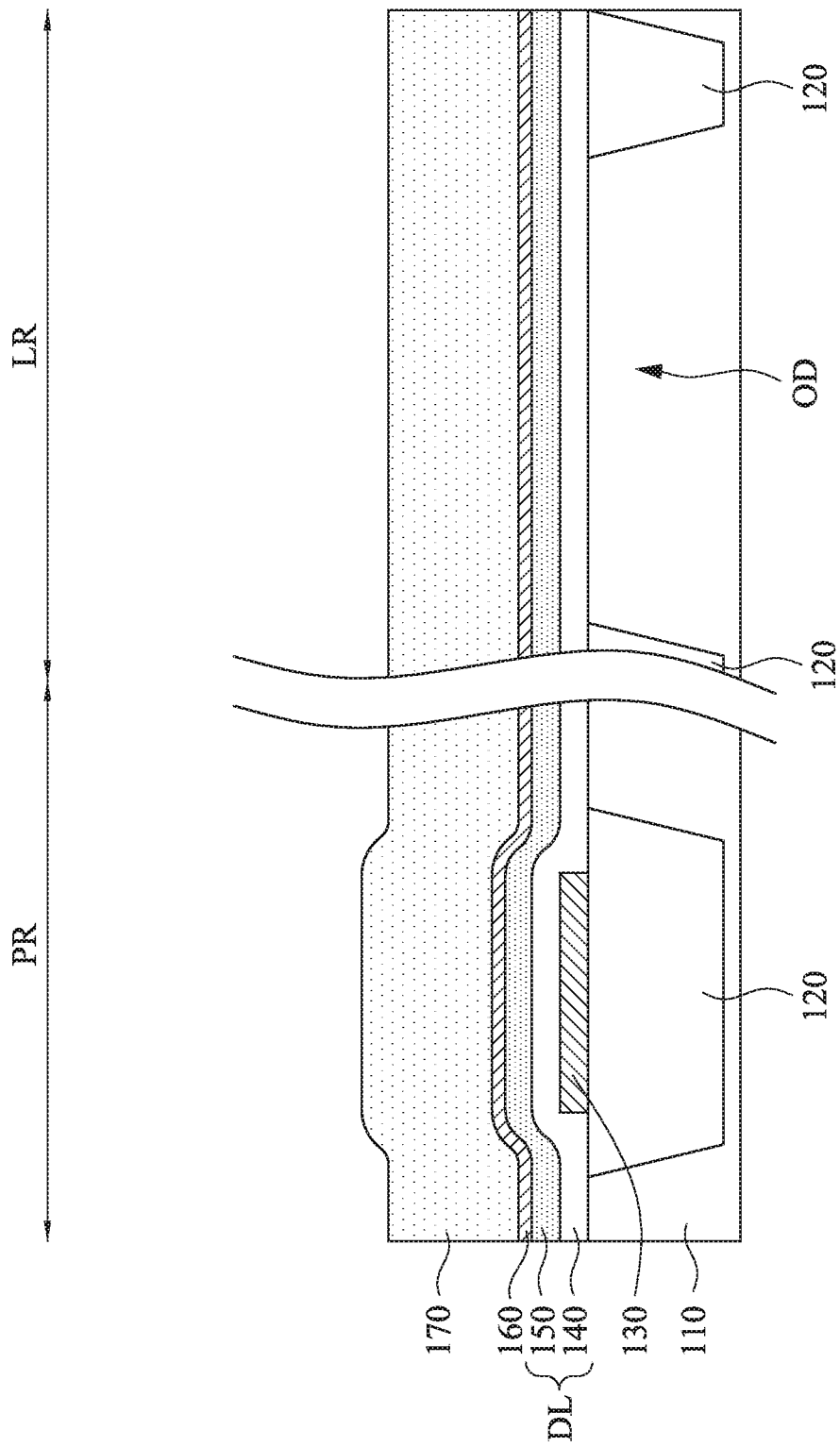

Referring to FIG. 1C, a dielectric layer stack DL, an electrode layer 160, and a dummy electrode layer 170 are formed over the structure of FIG. 1B in a sequence. The dielectric layer DL may include one or more dialectic layers. For example, the dielectric layer DL includes an oxide dielectric layer 140 and a high-k dielectric layer 150 over the oxide dielectric layer 140. The oxide dielectric layer 140 is conformally deposited over the capacitor bottom electrode 130 and the top surface of the substrate 110. The oxide dielectric layer 140 include oxide, such as silicon oxide. The oxide dielectric layer 140 may be formed by suitable deposition processes, such as chemical vapor deposition (CVD), physical vapor deposition (PVD), atomic layer deposition (ALD), plasma enhanced CVD (PECVD) or other suitable techniques.

The high-k dielectric layer 150 is then conformally deposited over the oxide dielectric layer 140. The high-k dielectric layer 150 has a dielectric constant greater than about that of the oxide dielectric layer 140. For example, the dielectric constant of the high-k dielectric layer 150 is greater than about 10. The high-k dielectric layer 150, for example, may include, but is not limited to, high-K dielectrics such as tantalum oxide (e.g., $TaO_2$), tantalum pentaoxide (e.g., $Ta_2O_5$), hafnium oxide (e.g., $HfO_2$), aluminum oxide (e.g., $Al_2O_3$), indium oxide (e.g., $InO_2$), lanthanum oxide (e.g., $LaO_2$), zirconium oxide (e.g., $ZrO_2$), yttrium oxide (e.g., $Y_2O_3$), and combinations thereof. It will be appreciated by those skilled in the art that the thickness of the high-k dielectric layer 150 will depend in part on design constraints of a gate dielectric structure as well as a desired capacitance of an MIM structure, e.g., 5 angstroms to 1000 angstroms. The high-k dielectric layer 150 may be formed by suitable deposition processes, such as chemical vapor deposition (CVD), physical vapor deposition (PVD), atomic layer deposition (ALD), plasma enhanced CVD (PECVD) or other suitable techniques.

The electrode layer 160 is conformally deposited over the high-k dielectric layer 150. The electrode layer 160 is used to protect the high-k dielectric layer 150 in a subsequent etching process (e.g. an etching process during the removal of the dummy electrode layer 170). In some embodiments, a conductive gate (e.g., metal gate or polysilicon gate) will be formed over an element patterned from the electrode layer 160 later, such that the thickness of the electrode layer 160 may be designed regardless of the electrical resistance. For example, the thickness of the electrode layer 160 may be designed to be thinner than that of the capacitor bottom electrode 130. In some embodiments, the thickness of the electrode layer 160 may be in a range of about 10 angstroms to about 100 angstroms for protecting the high-k dielectric layer 150 and reducing the overall device size.

In some embodiments, the electrode layer 160 may include metals for providing work function suitable for a logic device (e.g., a transistor). For example, the electrode layer 160 may include a work function conductive layer. The work function conductive layer may include one or more n-type work function metals (N-metal) for forming an n-type transistor. The n-type work function metals may exemplarily include, but are not limited to, titanium aluminide (TiAl), titanium aluminium nitride (TiAlN), tantalum nitride (TaN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function conductive layer may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. The formation of the electrode layer 160 may include PVD, CVD, electrodeposition, or similar, as is appropriate for the material being deposited. In some embodiments, the material of the electrode layer 160 is the same as that of the capacitor bottom electrode 130. For example, the capacitor bottom electrode and the electrode layers 160 are both made of TiN.

The dummy electrode layer 170 is then formed over the electrode layer 160. The dummy electrode layer 170 may include polycrystalline-silicon (poly-Si), poly-crystalline silicon-germanium (poly-SiGe), metallic nitrides, metallic silicides, metallic oxides, or metals. In some embodiments, the dummy electrode layer 170 includes a metal-containing material such as TiN, TaN, TaC, Co, Ru, Al, combinations thereof, or multi-layers thereof. Further, the dummy electrode layer 170 may be doped poly-silicon with uniform or non-uniform doping. The dummy electrode layer 170 may be deposited by CVD, physical vapor deposition (PVD), sputter deposition, or other techniques suitable for depositing conductive materials.

Figure 1D:
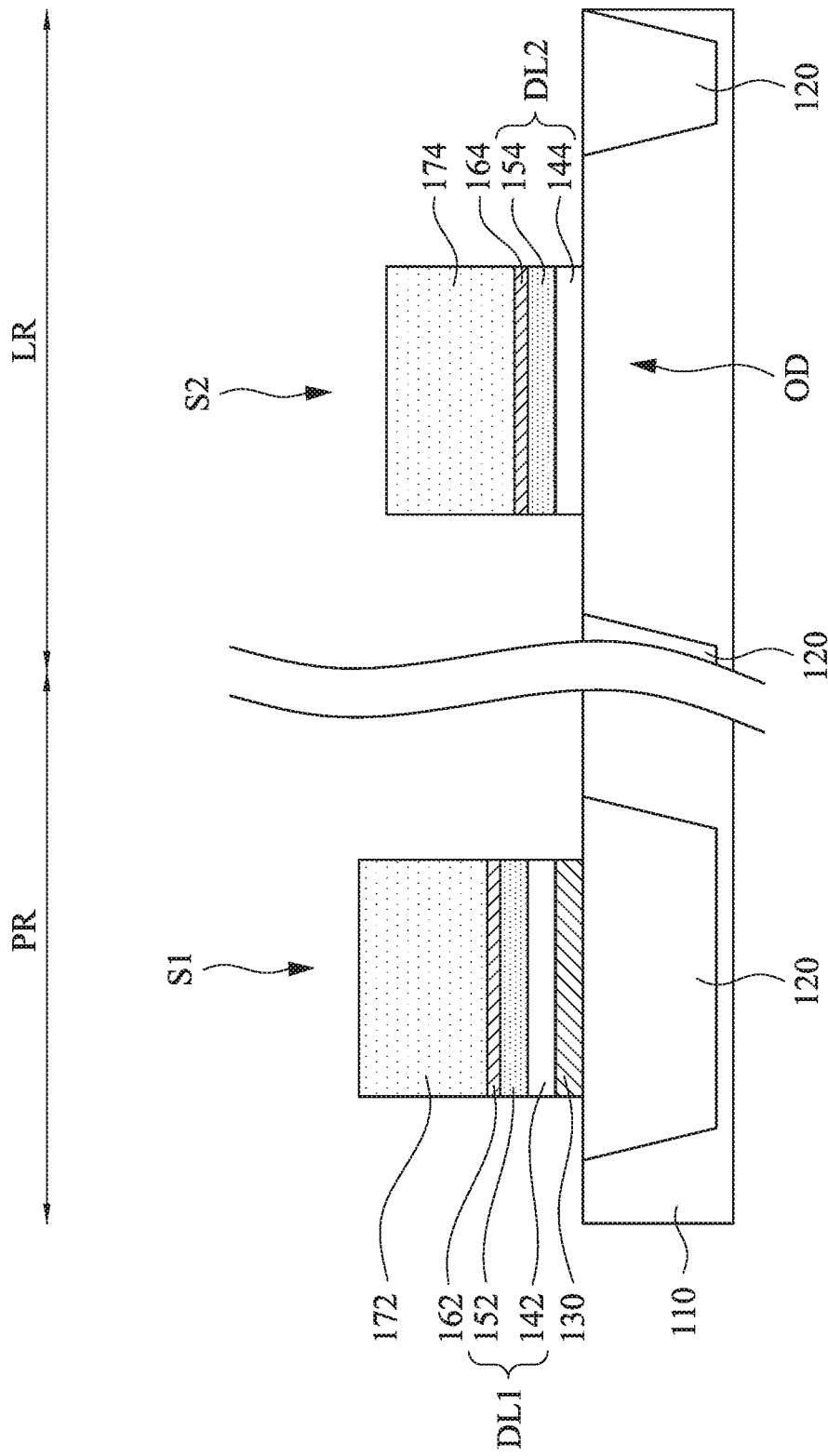

Next, referring to FIG. 1D, the dielectric layer 140, the high-k dielectric layer 150, the electrode layer 160, and the dummy electrode layer 170 (referring to FIG. 1C) are patterned, and a capacitor stack S1 and a gate stack S2 are formed. For example, a patterned mask is formed over a portion of the dummy electrode layer 170 (referring to FIG. 1C). The patterned mask may be a hard mask for protecting underlying portions of the layers 140-170 (referring to FIG. 1C) against subsequent etching process. The patterned mask may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

An etching process using the patterned mask is performed to the layers 140-170 (referring to FIG. 1C). Through the etching process, the dielectric layer DL is patterned into a capacitor dielectric DL1 and a gate dielectric DL2. For example, the dielectric layer 140 is patterned into a first capacitor dielectric 142 and a first gate dielectric 144. The high-k dielectric layer 150 is patterned into a second capacitor dielectric 152 and a second gate dielectric 154. The capacitor dielectric DL1 includes the first capacitor dielectric 142 and the second capacitor dielectric 152. The gate dielectric DL2 includes the first gate dielectric 144 and the second gate dielectric 154. The electrode layer 160 is patterned into a capacitor top electrode 162 and a work function layer 164. The dummy electrode layer 170 is patterned into a dummy capacitor electrode 172 and the dummy gate electrode 174. In some embodiments, the dummy capacitor electrode 172 and the dummy gate electrode 174 will be replaced with a replacement gate structure using a "gate-last" or replacement-gate process later.

Through the configuration, in the present embodiments, the capacitor stack S1 is formed over the isolation dielectric 120, and the capacitor stack S1 includes the capacitor bottom electrode 130, a capacitor dielectric DL1, the capacitor top electrode 162, and the dummy capacitor electrode 172. The gate stack S2 is formed over the oxide defined region OD, and the gate stack S2 includes the gate dielectric layer DL2, the work function layer 164, and the dummy gate electrode 174.

Figure 1E:
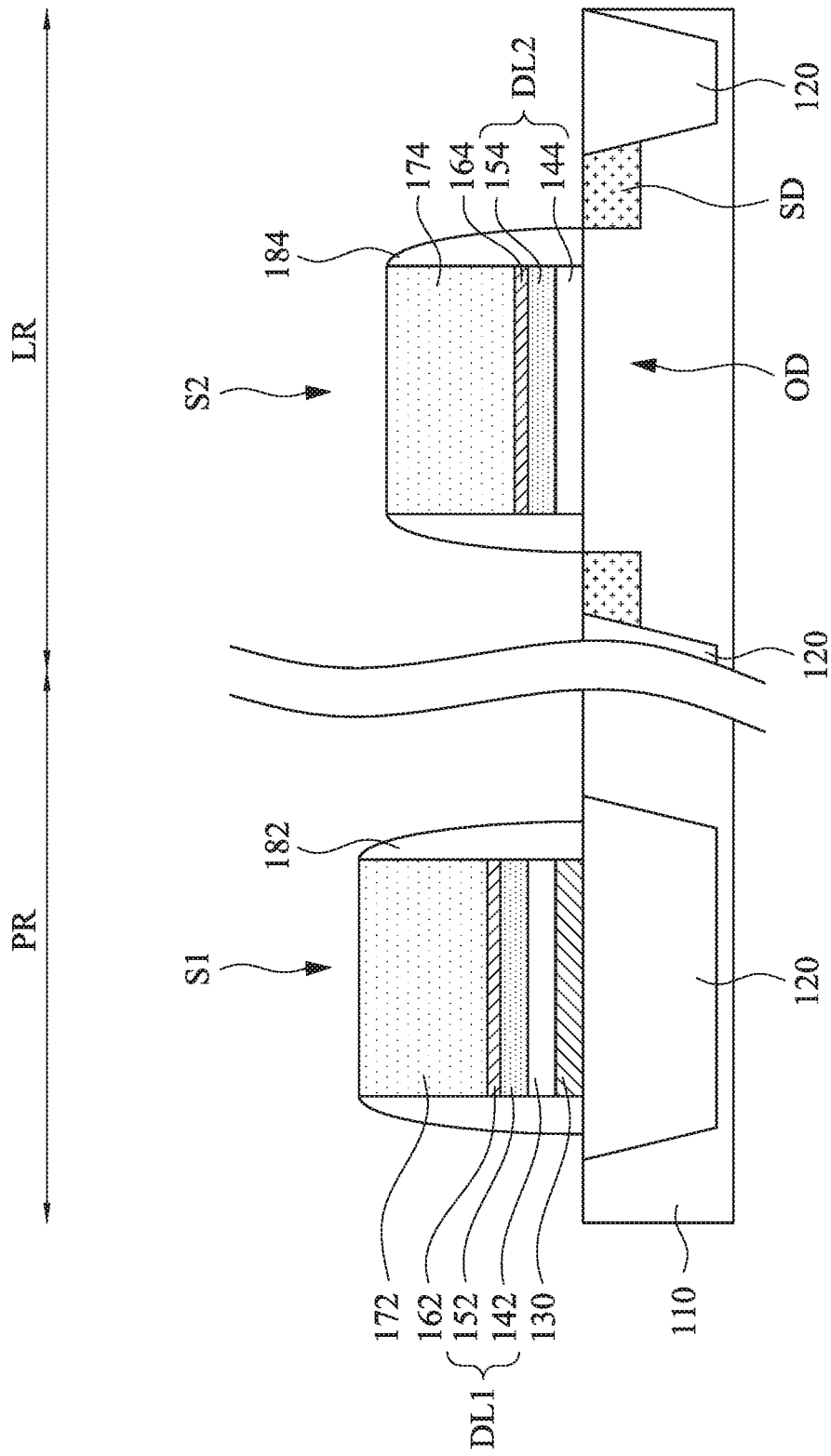

Referring to FIG. 1E, spacers 182 are formed on opposite sidewalls of the capacitor stack S1, and spacers 184 are formed on opposite sidewalls of the gate stack S2. In some embodiments, the spacers 182 and 184 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The spacers 182 and 184 may include a single layer or multilayer structure made of different dielectric materials. The method of forming the spacers 182 and 184 includes blanket forming a dielectric layer on the structure shown in FIG. 1D using, for example, CVD, PVD or ALD, and then performing an etching process such as anisotropic etching to remove horizontal portions of the dielectric layer. The remaining portions of the dielectric layer on sidewalls of the stacks S1 and S2 can serve as the spacers 182 and 184. In some embodiments, during the formation of the spacers 182 and 184, the capacitor bottom electrode 130 is covered by the capacitor dielectric DL1, the capacitor top electrode 162, and the dummy capacitor electrode 172, and prevented from being etched by the etching process.

In some embodiments, source and drain regions SD are formed in the oxide defined regions OD after the formation of the spacers 182 and 184. In some embodiments, the source and drain regions SD are formed by performing an ion implantation process to the oxide defined regions OD. To be specific, dopants (e.g., n-type dopants or p-type dopants) are implanted into the substrate 110, thereby forming the source and drain regions SD. For example, the p-type dopant includes boron (B), gallium (Ga), and indium (In). In some examples, the n-type dopant includes phosphorus (P) and arsenic (As). The source and drain regions SD may have an impurity concentration high enough to be conductive. After the ion implantation process, an anneal process may be performed to activate the dopant.

The spacers 184 may be used to offset the source/drain regions SD, and the spacers 182 and 184 protect the stacks S1 and S2 from being damaged by the ion implantation process. The spacers 184 may further be used for designing or modifying the source/drain region profile.

Figure 1F:
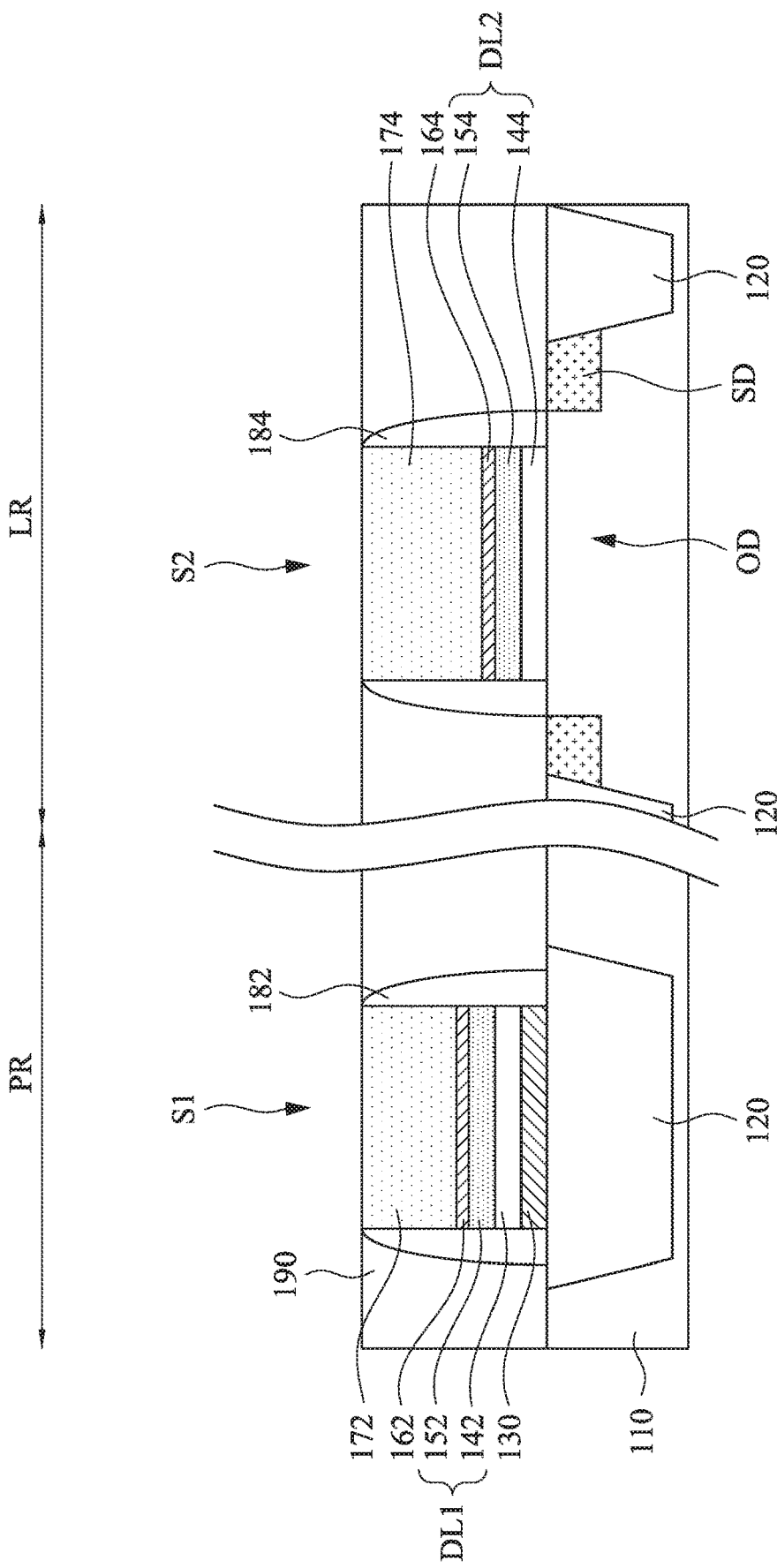

Referring to FIG. 1F, an interlayer dielectric (ILD) layer 190 is formed on the structure of FIG. 1E. In some embodiments, the ILD layer 190 may include oxides. For example, the ILD layer 190 may include silicon nitride, silicon oxynitride, tetraethoxysilane (TEOS), phosphosilicate glass (PSG), borophosphosilicate glass (BPSG), undoped silicon oxide (USG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 190 may be formed of a low-k dielectric material having a k value less than about 3.9. The k value of the ILD layer 190 may even be lower than about 2.8. The ILD layer 190 may be formed using, for example, CVD, ALD, spin-on-glass (SOG) or other suitable techniques. In some embodiments, a gap fill approach is implemented herein by repeating deposition and etch cycles for complete gap fill. Afterwards, a CMP process may be optionally performed to remove excessive material of the ILD layer 190 to expose the stacks S1 and S2. The CMP process may planarize a top surface of the ILD layer 190 with top surfaces of the stacks S1 and S2, and the spacers 182 and 184 in some embodiments.

In some embodiments, prior to the formation of the ILD layer 190, a contact etch stop layer (CESL) is blanket formed on the structure shown in FIG. 1E. The CESL includes a material different from that of the ILD layer 190. For example, the CESL includes silicon nitride, silicon oxynitride or other suitable materials. The CESL can be formed using, for example, plasma enhanced CVD, low pressure CVD, ALD or other suitable techniques.

Figure 1G:
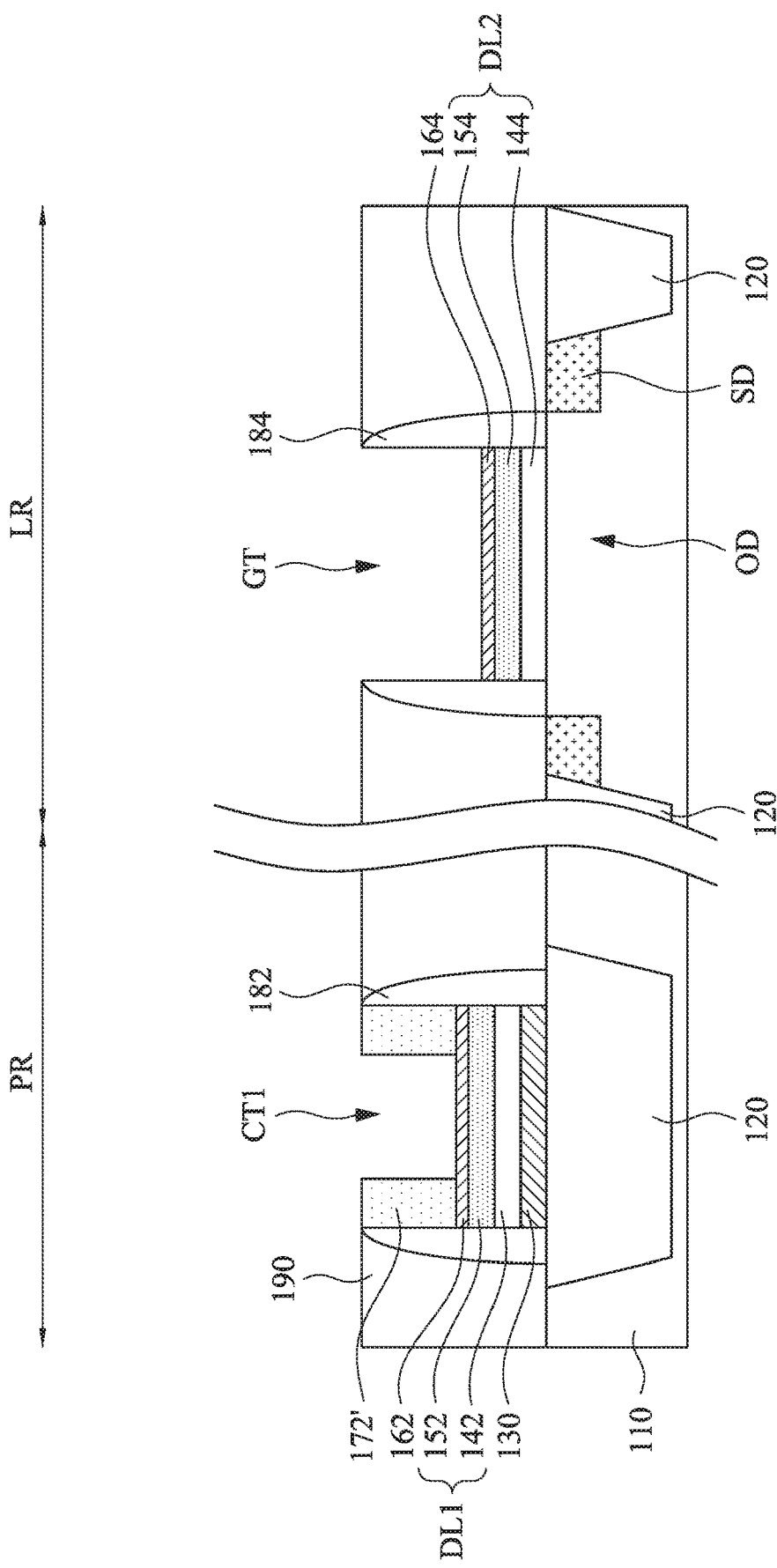

FIG. 1G illustrate removal of a portion of the dummy capacitor electrode 172 and removal of the dummy gate electrode 174 (referring to FIG. 1F). In some embodiments, the removals may include forming a patterned mask over the structure of FIG. 1F, and performing an etching process, such as a dry etching process, a wet etching process, or the combination thereof. The dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, the capacitor top electrode 162 and the work function layer 164 have a higher resistance to the etching process than that of the dielectric 152/154 and that of the dummy capacitor electrode 172/174 (referring FIG. 1F), such that the capacitor top electrode 162 and the work function layer 164 may serve as etch stop layers herein, thereby preventing the dielectrics 152 and 154 from being etched. In some embodiments, the spacers 184 may also have a higher resistance to the etching process than that of the dummy capacitor electrode 172/174 (referring FIG. 1F), thereby protecting the ILD layer 190 from being laterally etched.

After the removal, a trench CT1 is formed with the remaining portions of the dummy capacitor electrode 172 (referred to as the dummy capacitor electrode 172' herein) as their sidewalls, in which the capacitor top electrode 162 remains in the bottom of the trench CT1. Also, a trench GT is formed with the spacers 184 as their sidewalls, in which the work function layer 164 remains in the bottom of the trench GT.

Figure 1H:
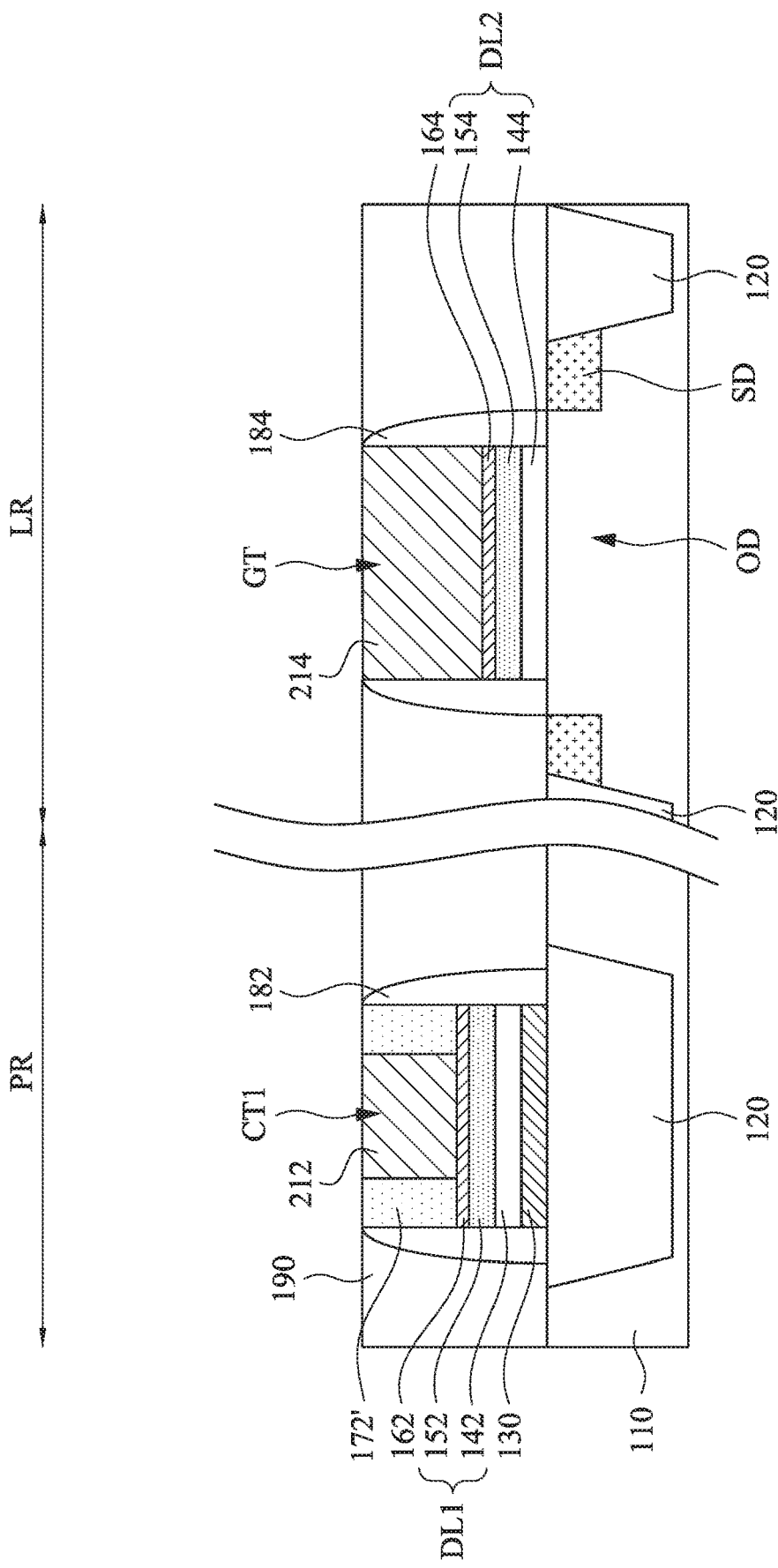

Referring to FIG. 1H, a capacitor top electrode 212 and a gate electrode 214 are formed in the trenches CT1 and GT respectively. In some embodiments, the formation of the electrodes 212 and 214 includes overfilling the trenches CT1 and GT with a gate electrode layer, and removing an excess portion of the gate electrode layer out of the trenches CT1 and GT, thereby forming the electrodes 212 and 214. The gate electrode layer may include a conductive layer. The conductive layer may exemplarily include metals, such as tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. In some embodiments, the metal layer is formed by ALD process. The removal may include a planarization process, such as a chemical mechanical polish (CMP) process.

In some embodiments, the gate electrode layer may further include a work function conductive layer blanketly formed on the structure shown in FIG. 1G, and then, the conductive layer is formed over the work function conductive layer. For example, each of the capacitor top electrode 212 and the gate electrode 214 may include a U-shaped work function conductive layer and a conductive layer filling an opening of the U-shaped work function conductive layer. The work function conductive layer includes work function metals to provide a suitable work function for the conductive layer. In some embodiments, the work function conductive layer may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function conductive layer 310 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. The material of the work function conductive layer may be the same as or different from that of the capacitor top electrode 162 and the work function layer 164. In some embodiments, the work function conductive layer is formed by ALD process.

Figure 1I:
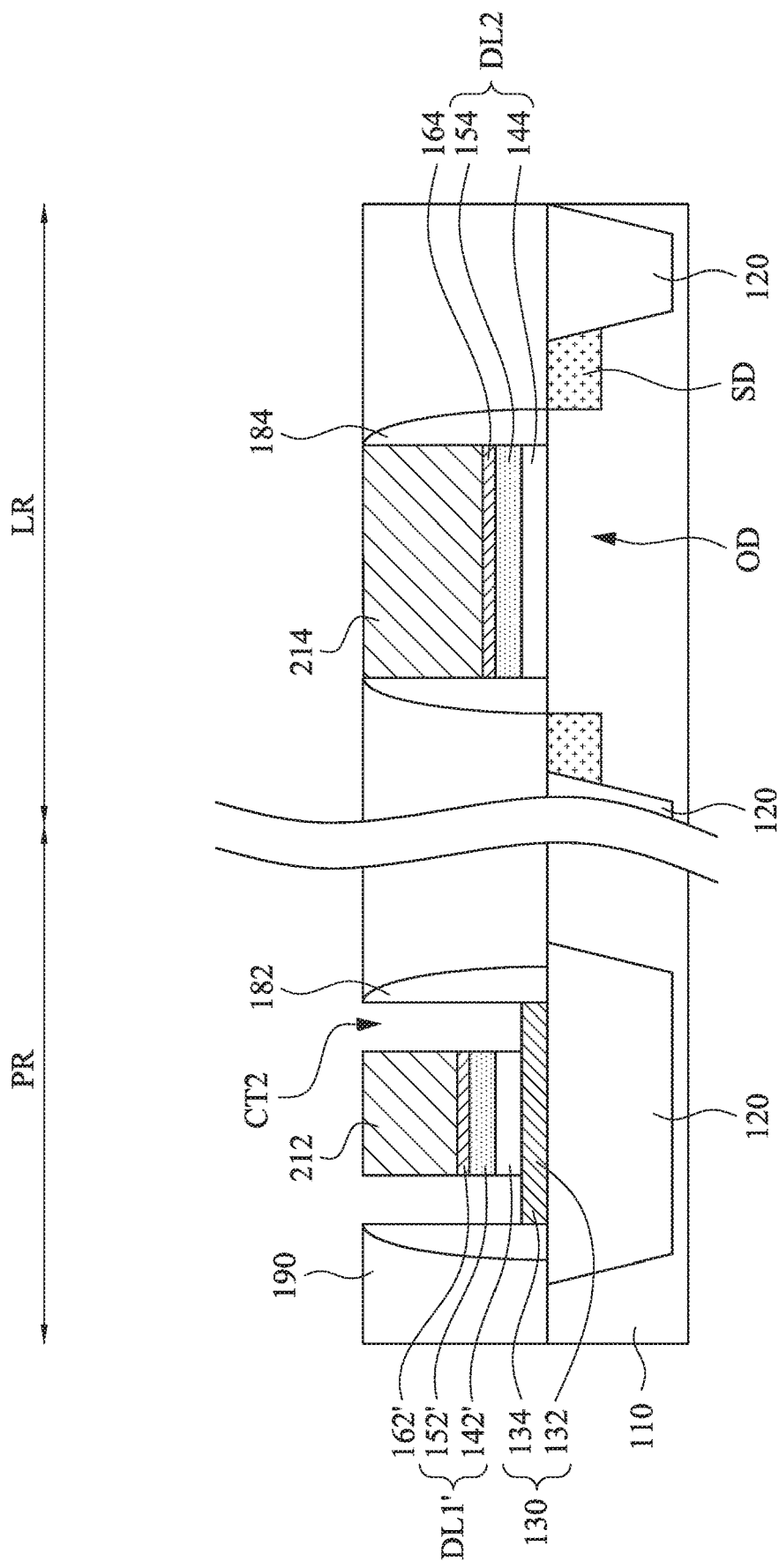

FIG. 1I illustrates removal of the dummy capacitor electrode 172', a portion of the capacitor top electrode 162, and a portion of the capacitor dielectric DL1 under the dummy capacitor electrode 172' (referring to FIG. 1H). In some embodiments, the removal may include forming a patterned mask over the structure of FIG. 1H, and performing an etching process, e.g., a dry etching process, a wet etching process, or the combination thereof. The dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, plural etching processes are used. The etching process(es) may be stopped when reaching the capacitor bottom electrode 130. In some embodiments, the capacitor bottom electrode 130 is thick enough to withstand the etching process(es), while the electrode 162/162' is thin enough to being partially removed during the etching process(es). In some embodiments, the capacitor bottom electrode 130 has a higher etch resistance to that to the etching process(es) than that of the dielectrics 152, 142, and the dummy capacitor electrode 172' (referring FIG. 1H), such that the capacitor bottom electrode 130 may remain after the etching process(es).

After the removal, the remaining portions of the elements 142-162 (referring to FIG. 1H) may be referred to as the elements 142'-162' respectively, and the remaining portion of the capacitor dielectric DL1 may be referred to as the capacitor dielectric DL1' hereinafter. The removal forms openings or trenches CT2 between the spacers 182 and a combination of the capacitor top electrode 212 and the elements 142'-162', while the capacitor bottom electrode 130 remains in the bottom of the openings or trenches CT2. The openings or trenches CT2 exposes portions 134 of the capacitor bottom electrode 130, and a portion 132 of the capacitor bottom electrode 130 remains covered by the top electrode 212.

Figure 1J:
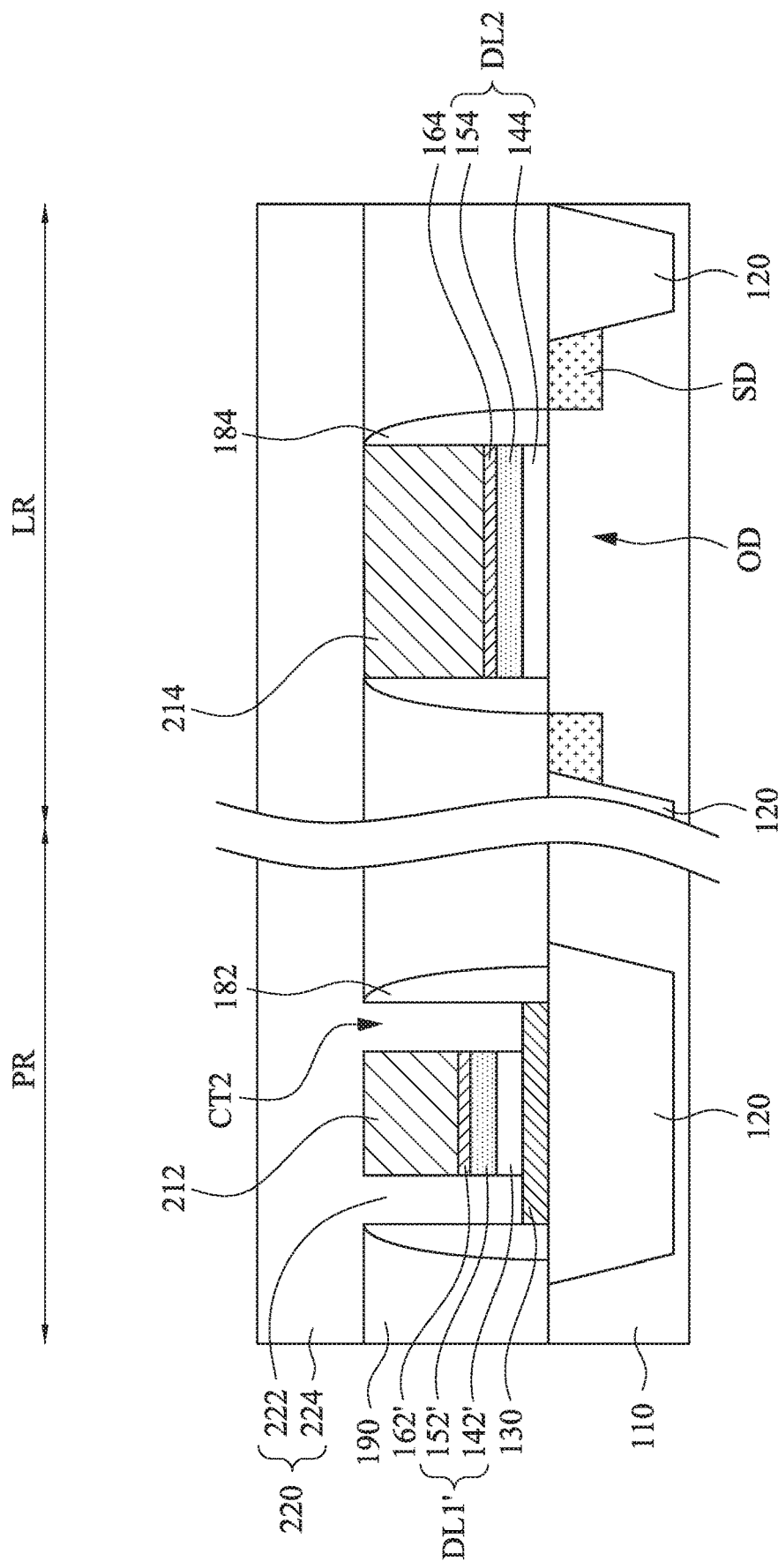

Referring to FIG. 1J, an ILD layer 220 is formed on the structure of FIG. 1I. The ILD layer 220 may overfill the trenches CT2. To be specific, ILD layer 220 has a first portion 222 and a second portion 224. The first portion 222 of the ILD layer 220 fills the trenches CT2 between the spacers 182 and a combination of the capacitor top electrode 212 and the elements 142'-162', and the second portion 224 of the ILD layer 220 is over the capacitor stack S1 and S2.

In some embodiments, the ILD layer 220 may include oxides. For example, the ILD layer 220 may include silicon oxide, silicon nitride, silicon oxynitride, tetraethoxysilane (TEOS), phosphosilicate glass (PSG), borophosphosilicate glass (BPSG), undoped silicon oxide (USG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 220 may be formed of a low-k dielectric material having a k value less than about 3.9. The k value of the ILD layer 220 may even be lower than about 2.8. The ILD layer 220 may be formed using, for example, CVD, ALD, spin-on-glass (SOG) or other suitable techniques. In some embodiments, a gap fill approach (e.g., IPM) is implemented herein by repeating deposition and etch cycles for complete gap fill.

Figure 1K:
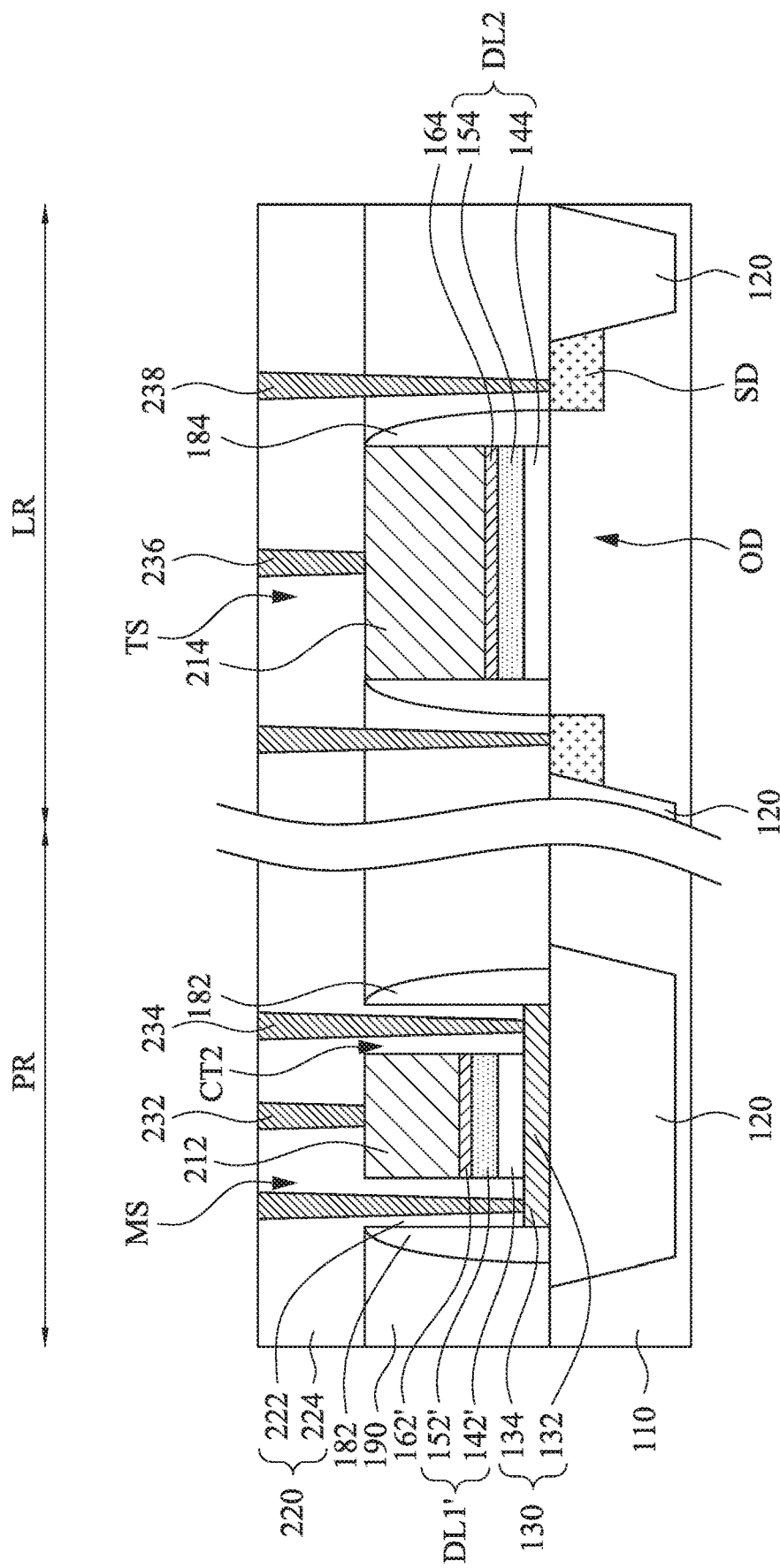

Referring to FIG. 1K, contact vias 232, 234, 236, and 238 are formed in the ILD layer 220. The contact vias 232 is in contact with the capacitor top electrode 212, and the contact vias 234 are in contact with the capacitor bottom electrode 130. The contact vias 236 is in contact with the gate electrode 214, and the contact vias 232 are in contact with the source/drain regions SD.

In some embodiments, the contact vias 232, 234, 236, and 238 may be titanium (Ti), tantalum (Ta), platinum (Pt), ruthenium (Ru), tungsten (W), aluminum (Al), copper (Cu), the like, and/or the combination thereof. Formation of the contact vias 232, 234, 236, and 238 includes, for example etching contact holes in the ILD layer 220 to respectively expose the capacitor top electrode 212, the capacitor bottom electrode 130, the gate electrode 214, and the source/drain regions SD, filling the contact holes with metals using a suitable deposition technique, and performing a planarization process (e.g. CMP) to remove excess metals outside the via holes while leaving metals in the contact holes to serve as the contact vias 232, 234, 236, and 238. Through the configuration the contact vias 234 is between the spacer 182 and a combination of the capacitor top electrode 212 and the elements 142'-162'.

A MIM capacitor structure MS and a transistor gate structure TS are formed in parallel in the regions PR and the logic region LR respectively. The MIM capacitor structure MS includes the capacitor bottom electrode 130, the capacitor dielectric DL1, the capacitor top electrode 162, and the capacitor top electrode 212, in which the contact vias 232 and 234 are respectively connected with the capacitor top electrode 212 and the capacitor bottom electrode 130. The transistor gate structure TS includes the source/drain regions SD, the gate dielectric layer DL2, the work function layer 164, and the gate electrode 214, in which the contact vias 236 and 238 are respectively connected with the gate electrode 214 and the source/drain regions SD.

In some embodiments of the present disclosure, the capacitor dielectric DL1 and the gate dielectric layer DL2 are formed before the gate replacement steps, and therefore the top surfaces of the capacitor dielectric DL1 and the gate dielectric layer DL2 remains flat, rather than conformal to the trenches, e.g., U-shaped. The capacitor top electrode 162 and the work function layer 164 have bottom surface in contact with the flat top surfaces of the capacitor dielectric DL1 and the gate dielectric layer DL2.

In some embodiments of the present disclosure, the capacitor top electrode 212 of the MIM capacitor structure MS and the gate electrode 214 of the transistor gate structure TS are formed using the gate last approach. The capacitor dielectric DL1 and the gate dielectric layer DL2, however, are formed before the replacement of the electrodes. The respective approach is thus sometimes referred to as a gate-last dielectric-first approach or a gate-last HK-first approach. In alternative embodiments, a gate-last dielectric-last approach (or gate-last HK-last approach) may be used. The process steps are similar to the steps shown in FIGS. 1A-1K, except that the capacitor dielectric DL1 and the gate dielectric layer DL2 are not formed before the formation of the dummy capacitor electrode 172 and the dummy gate electrode 174. Rather, the capacitor dielectric DL1 and the gate dielectric layer DL2 are formed after the removal of the dummy capacitor electrode 172 and the dummy gate electrode 174 (see the step shown in FIG. 1G), and is formed before the formation of the capacitor top electrode 212 and the gate electrode 214 as shown in FIG. 1H.

Figure 2B:
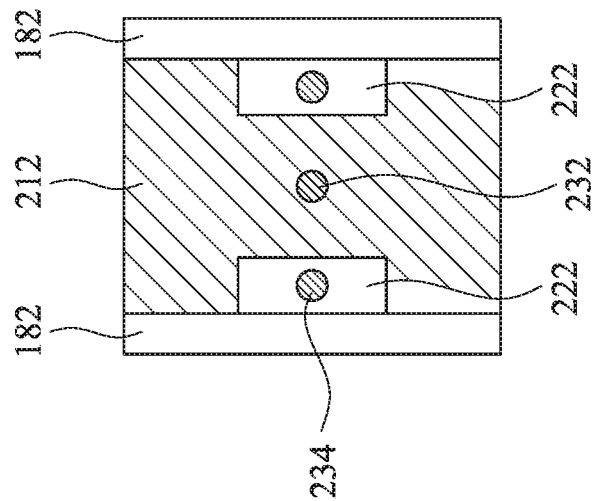
FIGS. 2A and 2B are schematic top views of a capacitor structure of semiconductor devices according to some embodiments of the present disclosure.
Figure 2A:
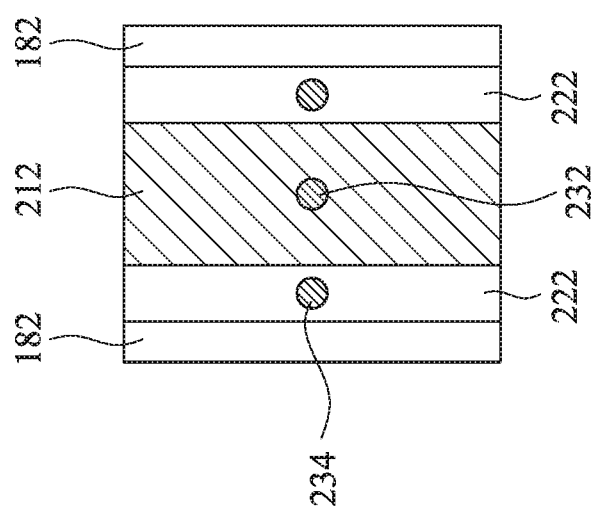

FIGS. 2A and 2B are schematic top views of the MIM capacitor structure MS of semiconductor devices according to some embodiments of the present disclosure. Referring to FIG. 2A and FIG. 1K, in some embodiments, the capacitor top electrode 212 and the elements 142'-162' are separated from the spacers 182 by the first portion 222 of the ILD layer 220. The contact vias 232 is in the second portion 224 and connected with the capacitor top electrode 212, while the contact vias 234 are in the first portion 222 and connected with the capacitor bottom electrode 130. Referring to FIG. 2B and FIG. 1K, in some embodiments, the capacitor top electrode 212 and the elements 142'-162' are connected with at least one of the spacers 182, and the first portion 222 of the ILD layer 220 is between said at least one of the spacers 182 and a combination of the capacitor top electrode 212 and the elements 142'-162'. For example, herein the capacitor top electrode 212 and the elements 142'-162' connected with both the spacers 182. However, it should not limit the scope of the present embodiments, in some embodiments, the combination of the capacitor top electrode 212 and the elements 142'-162' may be connected with one of the spacers 182 and separated from another of the spacers 182.

Figure 3:
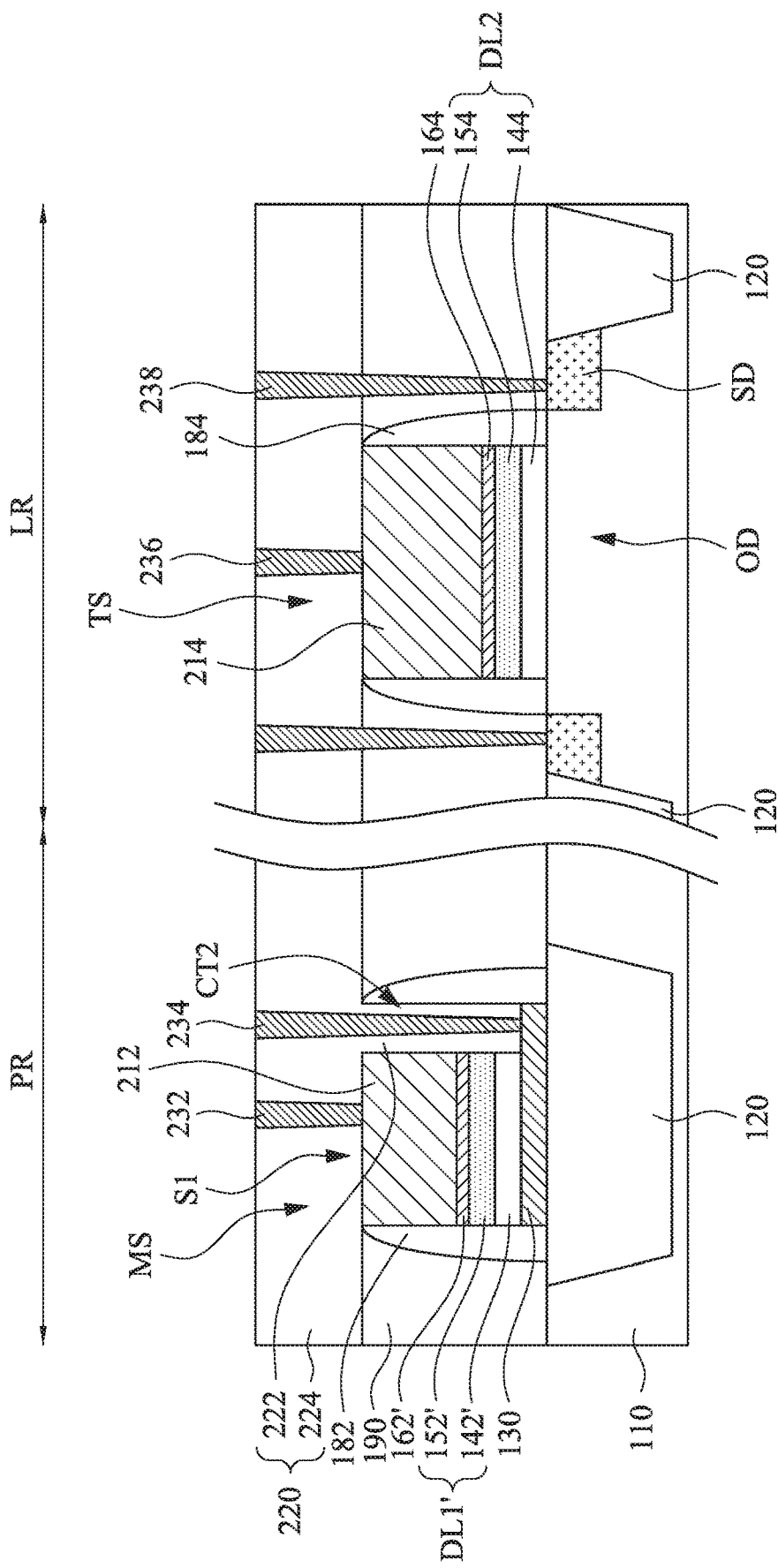
FIG. 3 is a cross-sectional view of a semiconductor device according to some embodiments of the present disclosure.

FIG. 3 is a cross-sectional view of a semiconductor device according to some embodiments of the present disclosure. The present embodiments are similar to the embodiments of FIG. 1K, and the difference between the present embodiments and the embodiments of FIG. 1K is that the trench CT2 is formed between one of the spacers 182 and a combination of the capacitor top electrode 212 and the elements 142'-162', and another of the spacers 182 remains on the sidewalls of the capacitor top electrode 212 and the elements 142'-162'. For example, in some embodiments, the capacitor dielectric 142', the second capacitor dielectric 152', and the capacitor top electrode 162', and the electrode 212 are separated from one of the spacers 182 in the present embodiments. Other details of the present embodiments are similar to those aforementioned, and not repeated herein.

Figure 4:
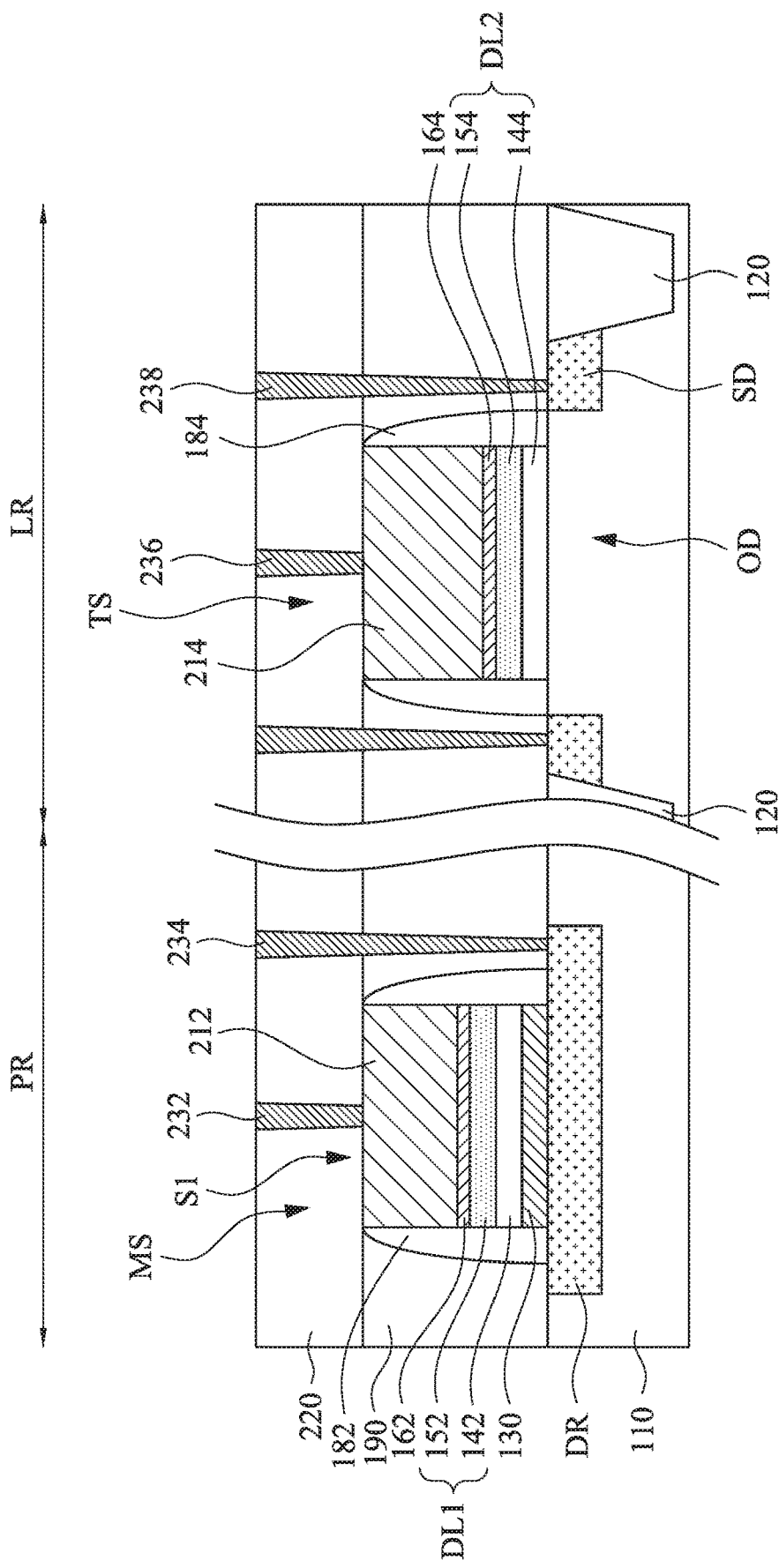
FIG. 4 is a cross-sectional view of a semiconductor device according to some embodiments of the present disclosure.

FIG. 4 is a cross-sectional view of a semiconductor device according to some embodiments of the present disclosure. The present embodiments are similar to the embodiments of FIG. 1K, and the difference between the present embodiments and the embodiments of FIG. 1K is that: a doped region DR is formed in the semiconductor substrate 110, and the capacitor stack S1 is formed over the doped region DR. The doped region DR may be formed by suitable ion implantation process. To be specific, prior to the formation of the capacitor bottom electrode 130, dopants (e.g., n-type dopants or p-type dopants) are implanted into the substrate 110, thereby forming the doped region DR. For example, the p-type dopant includes boron (B), gallium (Ga), and indium (In). In some examples, the n-type dopant includes phosphorus (P) and arsenic (As). The doped region DR may have an impurity concentration high enough to be lower an extension resistance, which in turn will make the doped region DR of the substrate 110 conductive. After the ion implantation process, an anneal process may be performed to activate the dopant.

In the present embodiments, at least a portion of the doped region DR may be exposed by the capacitor stack S1 and the spacers 182 and connected with the contact vias 234, which in turn will enable the contact vias 234 being electrically connected with the capacitor bottom electrode 130 of the capacitor stack S1 through the doped region DR. In the present embodiments, the capacitor top electrode 212, the capacitor top electrode 162, the second capacitor dielectric 152, and the capacitor dielectric 142 are not etched, such that the spacers 182 remains on sidewalls of the capacitor stack S1. In the present embodiments, the contact vias 234 is in the ILD layers 190 surrounding the MIM capacitor structure MS and the transistor gate structure TS, rather than in between the capacitor stack S1 and the spacer 182 of the MIM capacitor structure. Other details of the present embodiments are similar to those aforementioned, and not repeated herein.

Figure 5:
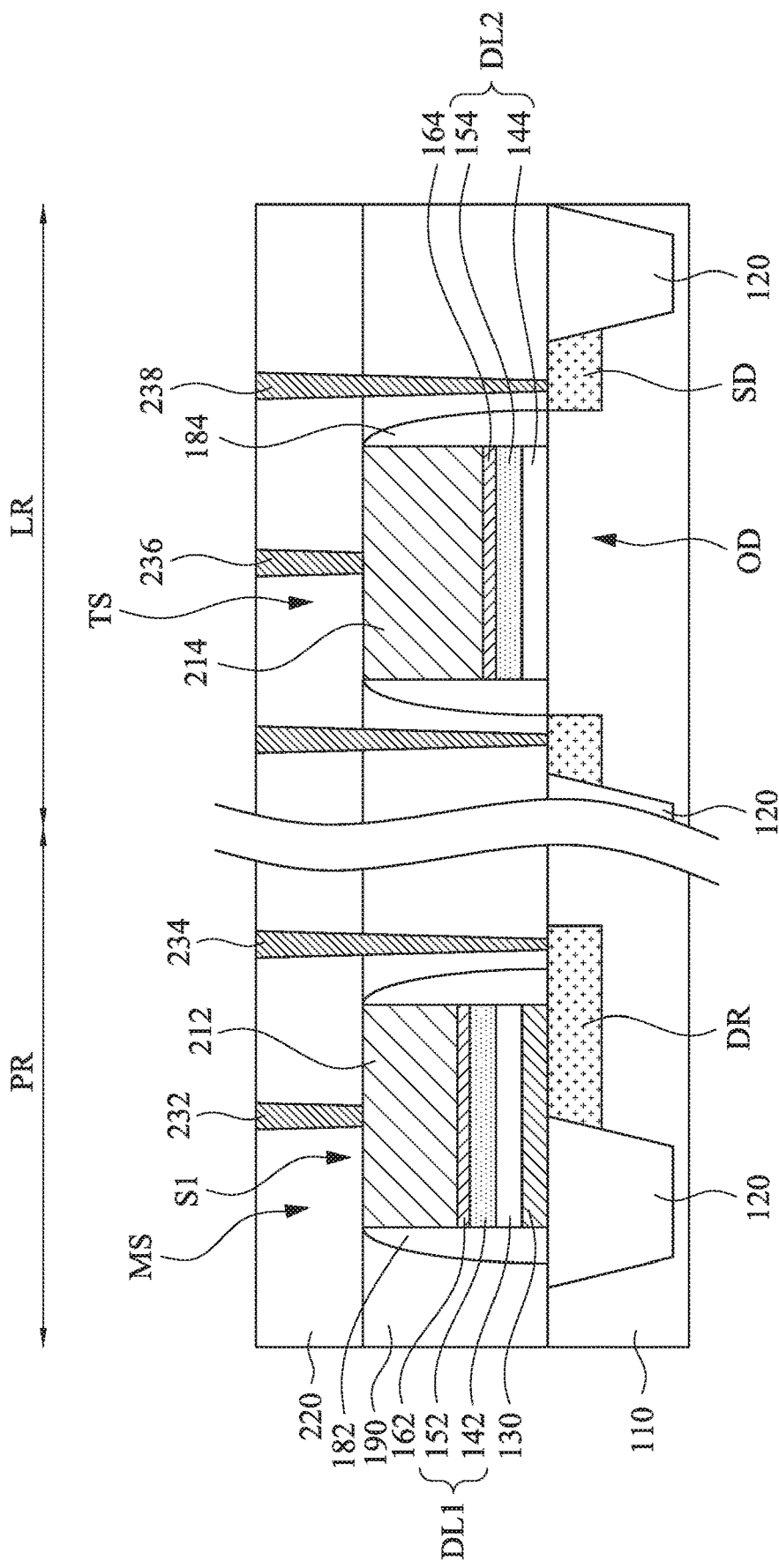
FIG. 5 is a cross-sectional view of a semiconductor device according to some embodiments of the present disclosure.

FIG. 5 is a cross-sectional view of a semiconductor device according to some embodiments of the present disclosure. The present embodiments are similar to the embodiments of FIG. 4, and the difference between the present embodiments and the embodiments of FIG. 4 is that: in the present embodiments, the capacitor stack S1 is over the doped region DR and the isolation dielectric 120. Through the configuration, the capacitor stack S1 may occupy less active area, e.g., oxide defined regions OD. As aforementioned, the contact vias 234 may be electrically connected with the capacitor bottom electrode 130 of the capacitor stack S1 through the doped region DR exposed by the capacitor stack S1. Other details of the present embodiments are similar to those aforementioned, and not repeated herein.

Figure 6:
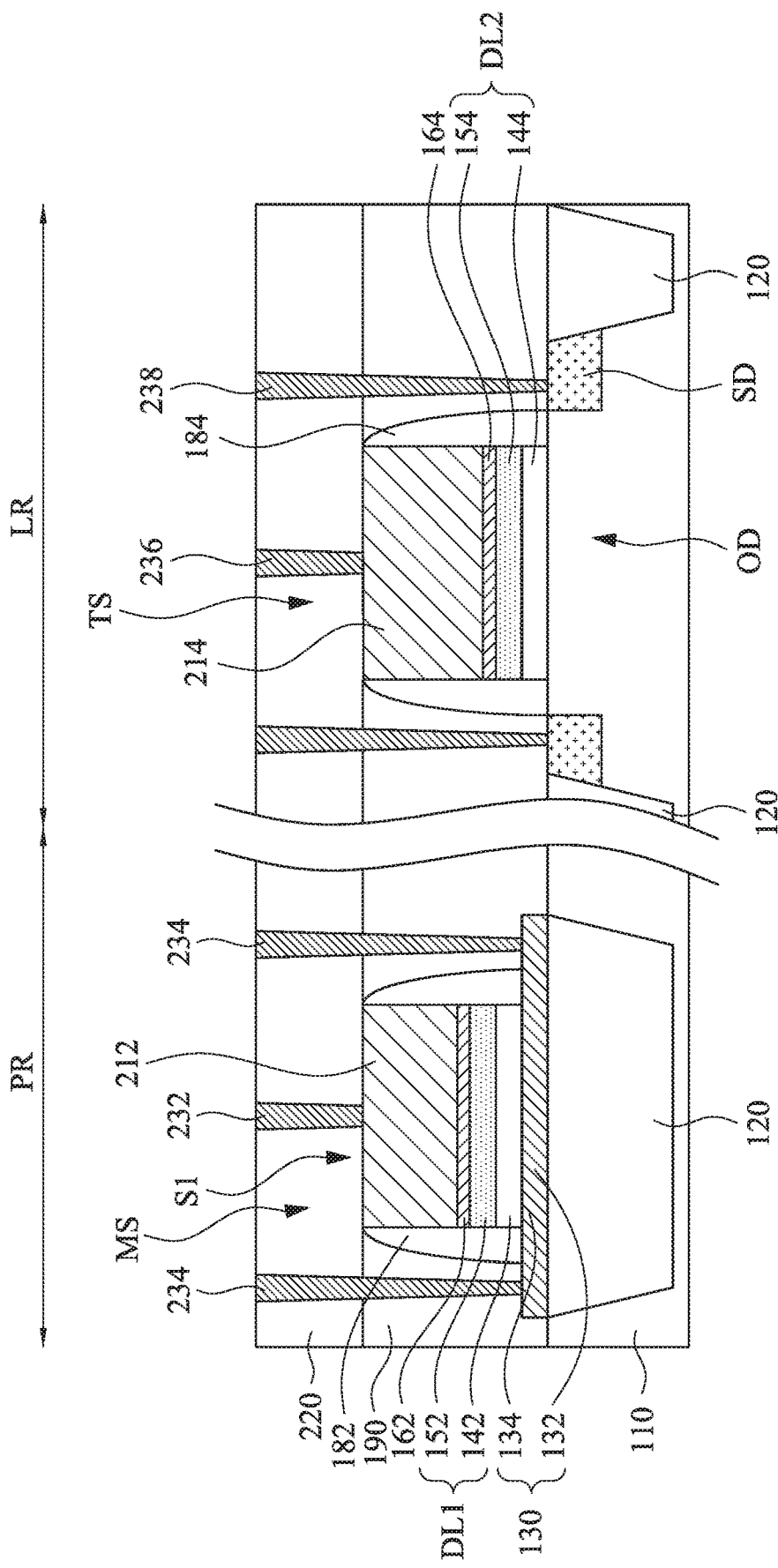
FIG. 6 is a cross-sectional view of a semiconductor device according to some embodiments of the present disclosure.

FIG. 6 is a cross-sectional view of a semiconductor device according to some embodiments of the present disclosure. The present embodiments are similar to the embodiments of FIG. 1K, and the difference between the present embodiments and the embodiments of FIG. 1K is that: the capacitor top electrode 212 and the spacers 182 cover a portion 132 of the capacitor bottom electrode 130, but expose portions 134 of the capacitor bottom electrode 130. In the present embodiments, the contact vias 234 is electrically connected with the portions 134 of the capacitor bottom electrode 130 of the capacitor stack S1. In the present embodiments, the capacitor top electrode 212, the capacitor top electrode 162, the second capacitor dielectric 152, and the capacitor dielectric 142 are not etched, such that the spacers 182 remains at sidewalls of the capacitor stack S1. In the present embodiments, the contact vias 234 is in the ILD layer 190 and the second portion 224 of the ILD layer 220, rather than in the first portion 222 of the ILD layer 220 (referring to FIG. 1K) between the capacitor stack S1 and the spacer 182. Other details of the present embodiments are similar to those aforementioned, and not repeated herein.

Figure 7:
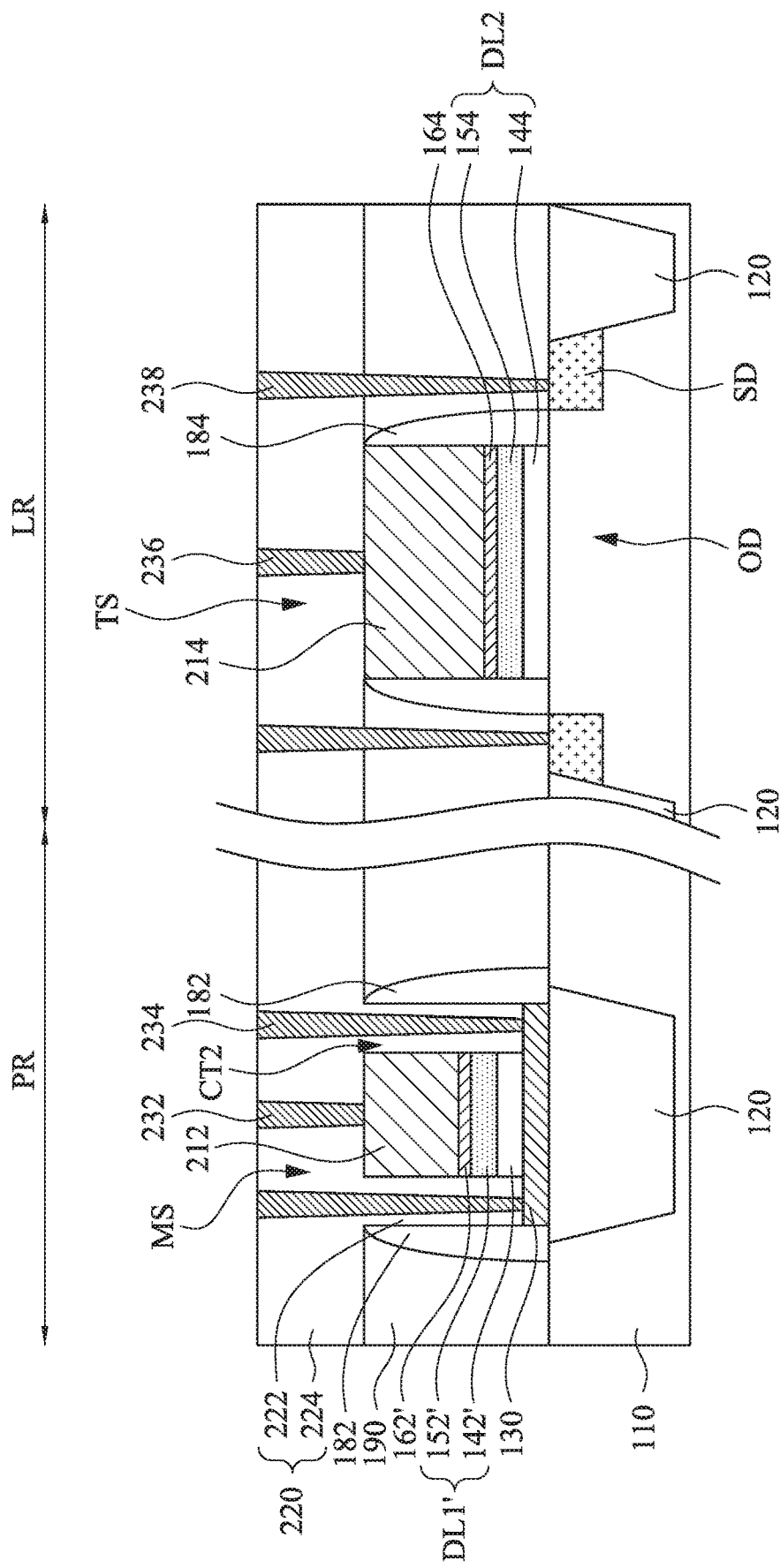
FIG. 7 is a cross-sectional view of a semiconductor device according to some embodiments of the present disclosure.

FIG. 7 is a cross-sectional view of a semiconductor device according to some embodiments of the present disclosure. The present embodiments are similar to the embodiments of FIG. 1K, and the difference between the present embodiments and the embodiments of FIG. 1K is that: in the present embodiments, the spacers 182 extends from a top surface of the isolation dielectric 120 to a top surface of the oxide defined regions OD of the substrate 210. That is, the spacers 182 crosses the isolation dielectric 120 and the oxide defined regions OD. In the present embodiments, the capacitor bottom electrode 130 remains being separated from the oxide defined regions OD by the spacers 182 and the solation dielectric 120, such that the performance of the MIM capacitor structure MS is kept from being influenced by the oxide defined regions OD. Other details of the present embodiments are similar to those aforementioned, and not repeated herein.

Figure 8:
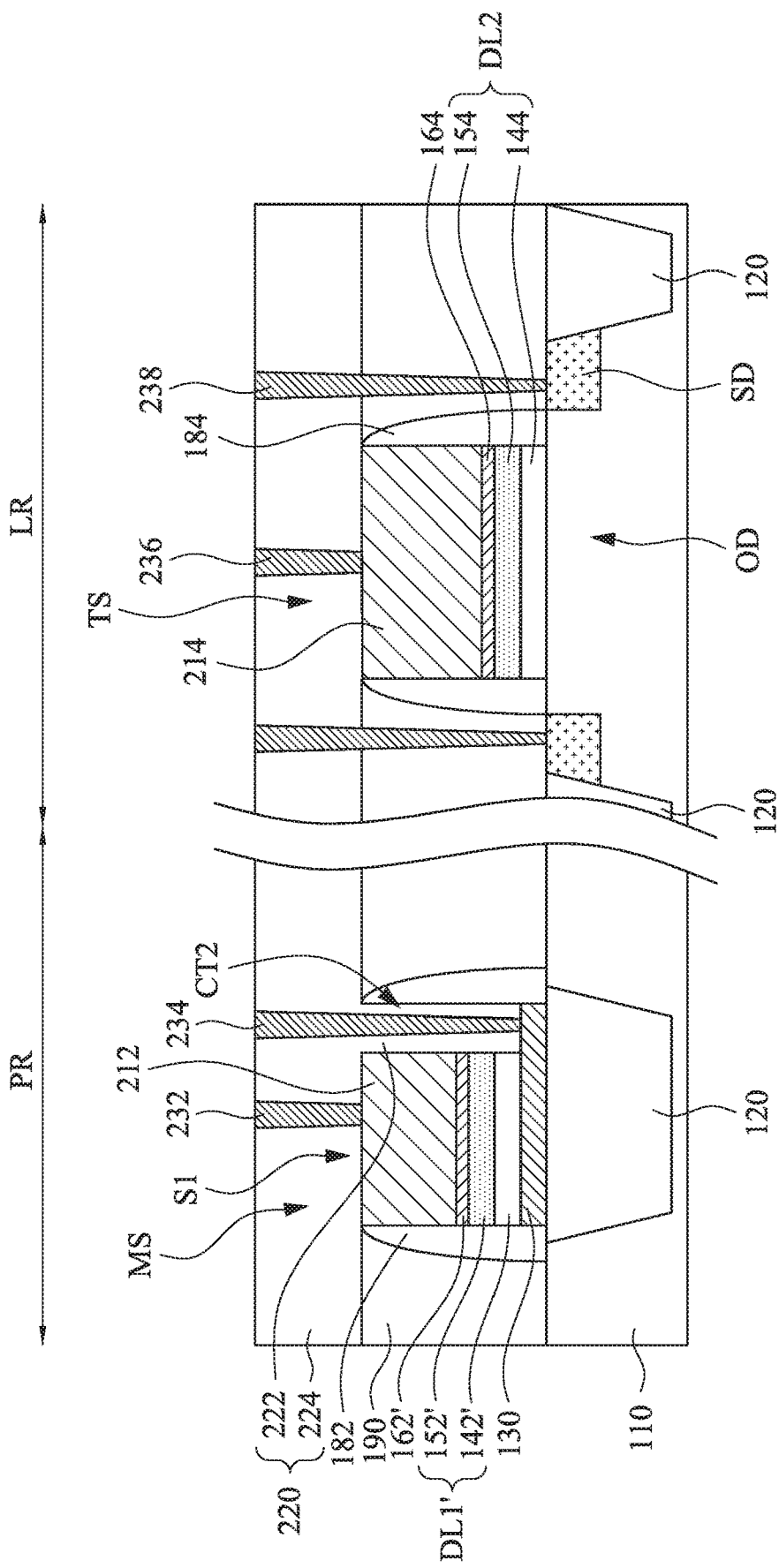
FIG. 8 is a cross-sectional view of a semiconductor device according to some embodiments of the present disclosure.

FIG. 8 is a cross-sectional view of a semiconductor device according to some embodiments of the present disclosure. The present embodiments are similar to the embodiments of FIG. 3, and the difference between the present embodiments and the embodiments of FIG. 3 is that: the spacers 182 extends from a top surface of the isolation dielectric 120 to a top surface of the oxide defined regions OD of the substrate 210. In the present embodiments, the capacitor bottom electrode 130 remains being separated from the oxide defined regions OD by the spacers 182 and the solation dielectric 120, such that the performance of the MIM capacitor structure MS is kept from being influenced by the oxide defined regions OD. Other details of the present embodiments are similar to those aforementioned, and not repeated herein.

Figure 9:
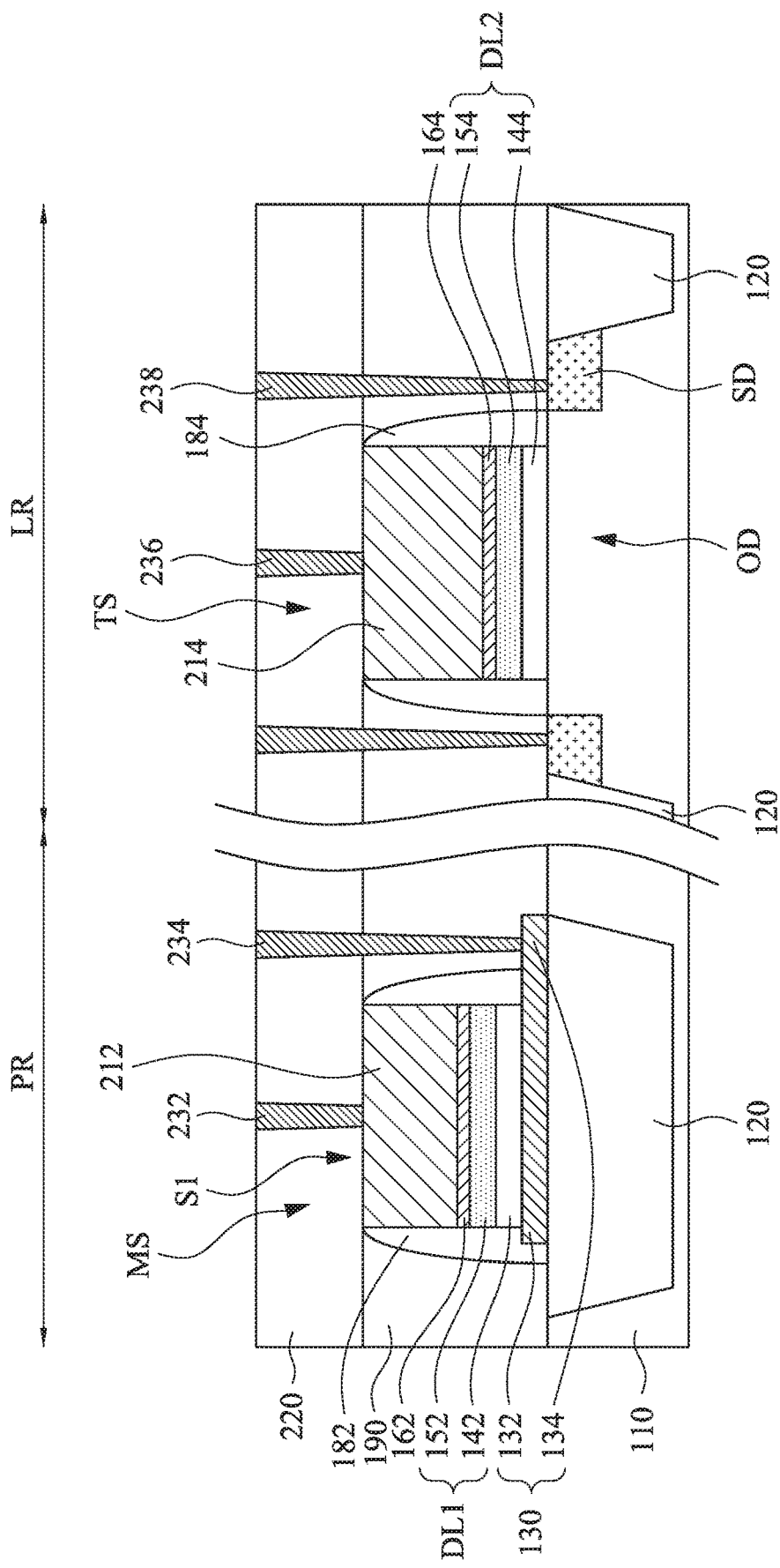
FIG. 9 is a cross-sectional view of a semiconductor device according to some embodiments of the present disclosure.

FIG. 9 is a cross-sectional view of a semiconductor device according to some embodiments of the present disclosure. The present embodiments are similar to the embodiments of FIG. 6, and the difference between the present embodiments and the embodiments of FIG. 6 is that: one of the spacers 182 covers a sidewall of the first portion 132 of the capacitor bottom electrode 130. For example, said one of the spacers 182 extends from a top surface of the isolation dielectric 120 alongside one of the sidewalls of the capacitor stack S1 to the ILD 220, while another one of the spacers 182 extends from a top surface of the second portion 134 of the capacitor bottom electrode 130 alongside another of the sidewalls of the capacitor stack S1 to the ILD 220. Through the configuration, the first portion 132 of the capacitor bottom electrode 130 is prevented from being etched during the formation of the spacers 182. Other details of the present embodiments are similar to those aforementioned, and not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a capacitor and a transistor are integrally formed without needing extra productivity, thereby improving production efficiency. Another advantage is that the capacitor top and bottom electrodes may serve as etch stop layers during etching processes in the formation of the MIM capacitor structure, thereby benefiting the fabrication process control. Still another advantage is that a capacitor bottom electrode is covered by a capacitor top electrode during formation of spacers, and therefore the capacitor bottom electrode may be prevented from being etched by etching process used for patterning the spacers.

According to some embodiments of the present disclosure, a semiconductor device includes a semiconductor substrate, a capacitor structure, a first contact plug, and a spacer. The capacitor structure is over the semiconductor substrate. The capacitor structure includes a bottom electrode, a capacitor dielectric, and a top electrode. The bottom electrode is over the semiconductor substrate. The capacitor dielectric is over a first portion of the bottom electrode. The top electrode is over the capacitor dielectric. The first contact plug is over and electrically connected to a second portion of the bottom electrode. The spacer is adjacent at least a sidewall of the second portion of the bottom electrode.

According to some embodiments of the present disclosure, a semiconductor device includes a semiconductor substrate, a capacitor structure, and a transistor gate structure. The semiconductor substrate has a first region and a second region. The capacitor structure includes a bottom electrode, a capacitor dielectric, and a top electrode. The bottom electrode is over the first region of the semiconductor substrate. The capacitor dielectric is over the bottom electrode. The top electrode is over the capacitor dielectric. The gate dielectric is over the second region of the semiconductor substrate. The gate electrode is over the gate dielectric. A top surface of the gate electrode of the transistor gate structure is at a position higher than a top surface of the bottom electrode of the capacitor structure.

According to some embodiments of the present disclosure, a semiconductor device includes a semiconductor substrate, an isolation dielectric, and a capacitor structure. The isolation dielectric is in the semiconductor substrate.

The capacitor structure is over the semiconductor substrate. The capacitor structure includes a bottom electrode, a capacitor dielectric, and a top electrode. The bottom electrode is in contact with the isolation dielectric. The capacitor dielectric is over the bottom electrode. The top electrode is over the capacitor dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a capacitor structure over the semiconductor substrate, wherein the capacitor structure comprises:
   a bottom electrode over the semiconductor substrate;
   a capacitor dielectric over a first portion of the bottom electrode; and
   a top electrode over the capacitor dielectric;
   a first contact plug over and electrically connected to a second portion of the bottom electrode; and
   a spacer adjacent at least a sidewall of the second portion of the bottom electrode, wherein a bottom surface of the spacer is lower than a top surface of the bottom electrode, the spacer continuously extends from the bottom surface of the spacer to a top end of the spacer, and the top end of the spacer is higher than a top surface of the capacitor dielectric.

2. The semiconductor device of claim 1, wherein the first contact plug is between the capacitor dielectric of the capacitor structure and the spacer.

3. The semiconductor device of claim 1, further comprising:
   an interlayer dielectric layer over the second portion of the bottom electrode, wherein the interlayer dielectric layer is at least between the capacitor dielectric and the spacer, and the first contact plug is in the interlayer dielectric layer.

4. The semiconductor device of claim 3, wherein the interlayer dielectric layer further extends over the capacitor structure and the spacer.

5. The semiconductor device of claim 1, wherein the top end of the spacer is substantially at a position level with a top surface of the top electrode.

6. The semiconductor device of claim 1, further comprising:
   an isolation dielectric in the semiconductor substrate, where the bottom electrode is over and contacting the isolation dielectric.

7. The semiconductor device of claim 1, wherein the second portion of the bottom electrode is free of coverage by the capacitor dielectric and the top electrode.

8. The semiconductor device of claim 1, wherein the top end of the spacer is higher than a bottom end of the first contact plug.

9. A semiconductor device, comprising:
   a semiconductor substrate having a first region and a second region;
   a capacitor structure comprising:
   a bottom electrode over the first region of the semiconductor substrate;
   a capacitor dielectric over the bottom electrode, wherein the capacitor dielectric of the capacitor structure comprises a first capacitor dielectric layer and a second capacitor dielectric layer over the first capacitor dielectric layer; and
   a top electrode over the capacitor dielectric; and
   a transistor gate structure comprising:
   a gate dielectric over the second region of the semiconductor substrate, wherein the gate dielectric comprises a first gate dielectric layer and a second gate dielectric layer over the first gate dielectric layer, the first gate dielectric layer comprises a material the same as that of the first capacitor dielectric layer, and the second gate dielectric layer comprises a material the same as that of the second capacitor dielectric layer; and
   a gate electrode over the gate dielectric, wherein a top surface of the gate electrode of the transistor gate structure is at a position higher than a top surface of the bottom electrode of the capacitor structure.

10. The semiconductor device of claim 9, wherein the top electrode has a first electrode and a second electrode over the first electrode, and the bottom electrode is thicker than the first electrode.

11. The semiconductor device of claim 9, further comprising:
    a contact plug over and electrically connected to the bottom electrode of the capacitor structure.

12. The semiconductor device of claim 9, wherein the capacitor dielectric is covered by the top electrode.

13. The semiconductor device of claim 9, wherein the top surface of the gate electrode is substantially aligned laterally with a top surface of the top electrode of the capacitor structure.

14. The semiconductor device of claim 9, wherein the top electrode of the capacitor structure has a first electrode and a second electrode over the first electrode, the gate electrode of the transistor gate structure has a work function metal layer and a gate metal over the work function metal layer, the first electrode comprises a material the same as that of the work function metal layer, and the second electrode comprises a material the same as that of the gate metal.

15. A semiconductor device, comprising:
    a semiconductor substrate;
    an isolation dielectric in the semiconductor substrate;
    a capacitor structure over the semiconductor substrate, wherein the capacitor structure comprises:
    a bottom electrode in contact with the isolation dielectric;
    a capacitor dielectric over the bottom electrode; and
    a top electrode over the capacitor dielectric, wherein the top electrode has a first electrode and a second electrode over the first electrode; and
    a transistor gate structure over the semiconductor substrate, wherein the transistor gate structure comprises:
    a gate dielectric; and
    a gate electrode over the gate dielectric, wherein the gate electrode has a work function metal layer and a gate metal over the work function metal layer, the first electrode comprises a material the same as that of the work function metal layer, and the second electrode comprises a material the same as that of the gate metal.

16. The semiconductor device of claim 15, wherein the bottom electrode is free of contacting the semiconductor substrate.

17. The semiconductor device of claim 15, further comprises:
   a contact plug over and electrically connected to the bottom electrode.

18. The semiconductor device of claim 15, further comprising:
   a spacer adjacent a sidewall of the bottom electrode, wherein at least a portion of a sidewall of the capacitor dielectric is spaced apart from the spacer.

19. The semiconductor device of claim 18, wherein the spacer is in contact with the isolation dielectric.

20. The semiconductor device of claim 15, wherein the capacitor dielectric comprises an oxide dielectric layer and a high-k dielectric layer over the oxide dielectric layer.

* * * * *